United States Patent [19]
Ito

[11] Patent Number: 5,631,109
[45] Date of Patent: May 20, 1997

[54] EXPOSURE MASK COMPRISING TRANSPARENT AND TRANSLUCENT PHASE SHIFT PATTERNS

[75] Inventor: Shin-ichi Ito, Yokohama, Japan

[73] Assignee: Kabushiki Kaisha Toshiba, Kawasaki, Japan

[21] Appl. No.: 477,594

[22] Filed: Jun. 7, 1995

Related U.S. Application Data

[63] Continuation-in-part of Ser. No. 377,249, Jan. 24, 1995, which is a continuation-in-part of Ser. No. 91,357, Jul. 15, 1993, Pat. No. 5,409,789.

[30] Foreign Application Priority Data

Jul. 17, 1992 [JP] Japan ................... 4-191065
Sep. 25, 1992 [JP] Japan ................... 4-256779
May 25, 1993 [JP] Japan ................... 5-122815
Mar. 15, 1995 [JP] Japan ................... 7-055647

[51] Int. Cl.$^6$ ................................................ C03F 9/00
[52] U.S. Cl. ........................... 430/5; 430/323; 430/324
[58] Field of Search ........................... 430/5, 322, 323, 430/324

[56] References Cited

U.S. PATENT DOCUMENTS 5,318,868 6/1994 Hasegana et al. ................... 430/5

FOREIGN PATENT DOCUMENTS

| | | |
|---|---|---|
| 3-156459 | 7/1991 | Japan . |
| 3-267940 | 11/1991 | Japan . |
| 4-76550 | 3/1992 | Japan . |
| 4-204653 | 7/1992 | Japan . |
| 5-11433 | 1/1993 | Japan . |
| 6-95359 | 4/1994 | Japan . |

*Primary Examiner*—S. Rosasco
*Attorney, Agent, or Firm*—Finnegan, Henderson, Farabow, Garrett & Dunner, L.L.P.

[57] ABSTRACT

An exposure mask is formed by providing a mask pattern including a transparent phase shift pattern and a translucent phase shift pattern on a light-transmissive substrate. Each of the transparent phase shift pattern and the translucent phase shift pattern causes a relative phase difference of 180° to exposure light passing through each of the transparent phase shift pattern against exposure light passing through the light-transmissive substrate and the translucent phase shift pattern. The transparent phase shift pattern and the translucent phase shift pattern partly overlap each other. At least one opening portion in the mask pattern has at an adjacent region an overlap region of the transparent phase shift pattern and the translucent phase shift pattern region. A region of the translucent phase shift pattern is provided on the outside of the overlap region.

24 Claims, 24 Drawing Sheets

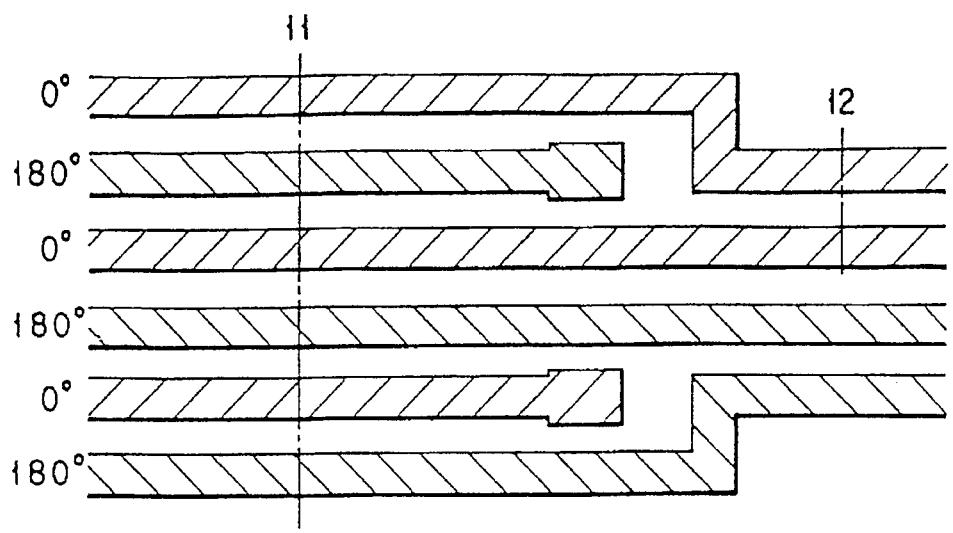
FIG. 1
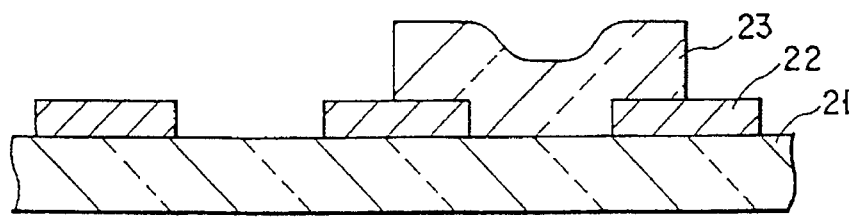
FIG. 2A
(PRIOR ART)
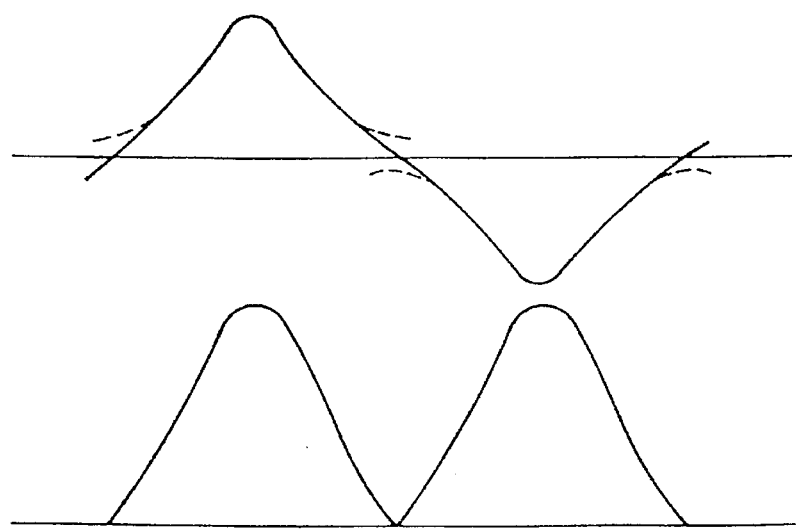
FIG. 2B
(PRIOR ART)
FIG. 2C
(PRIOR ART)

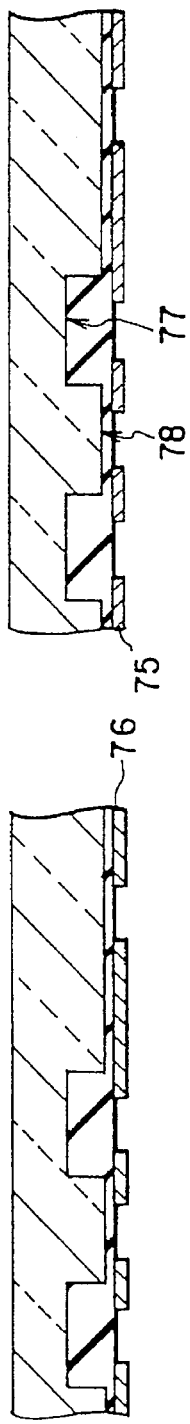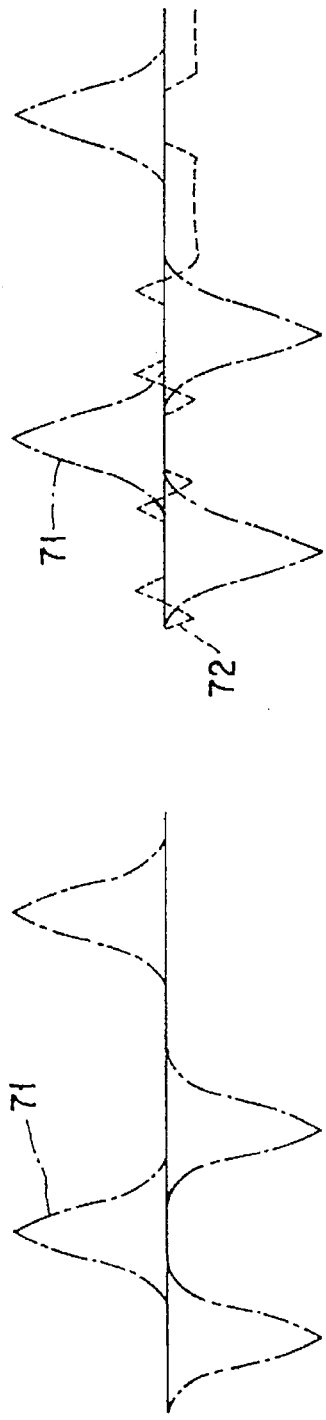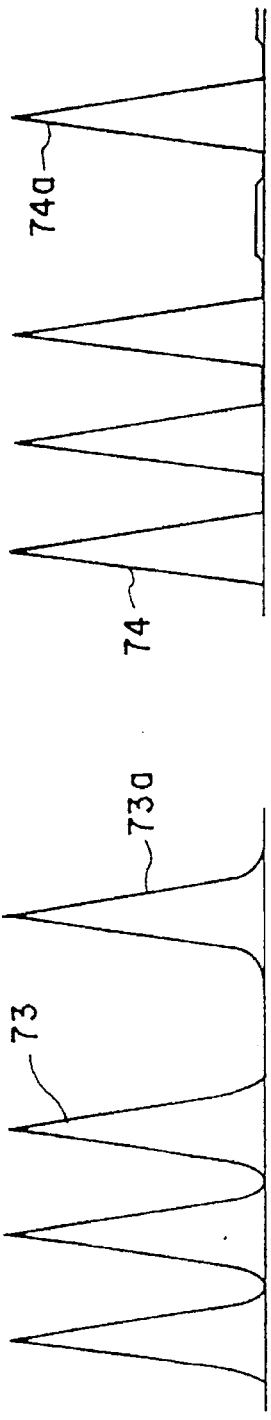

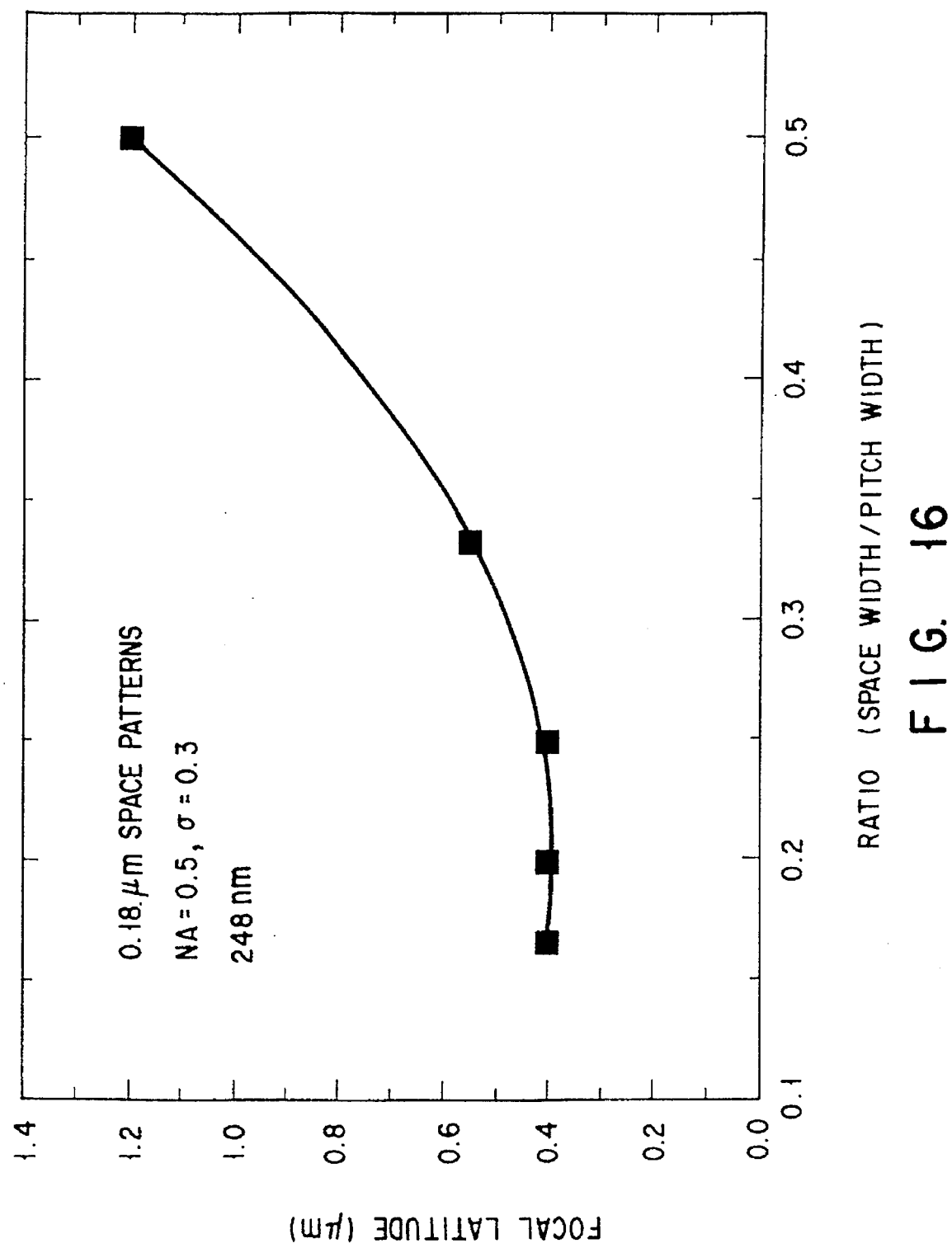

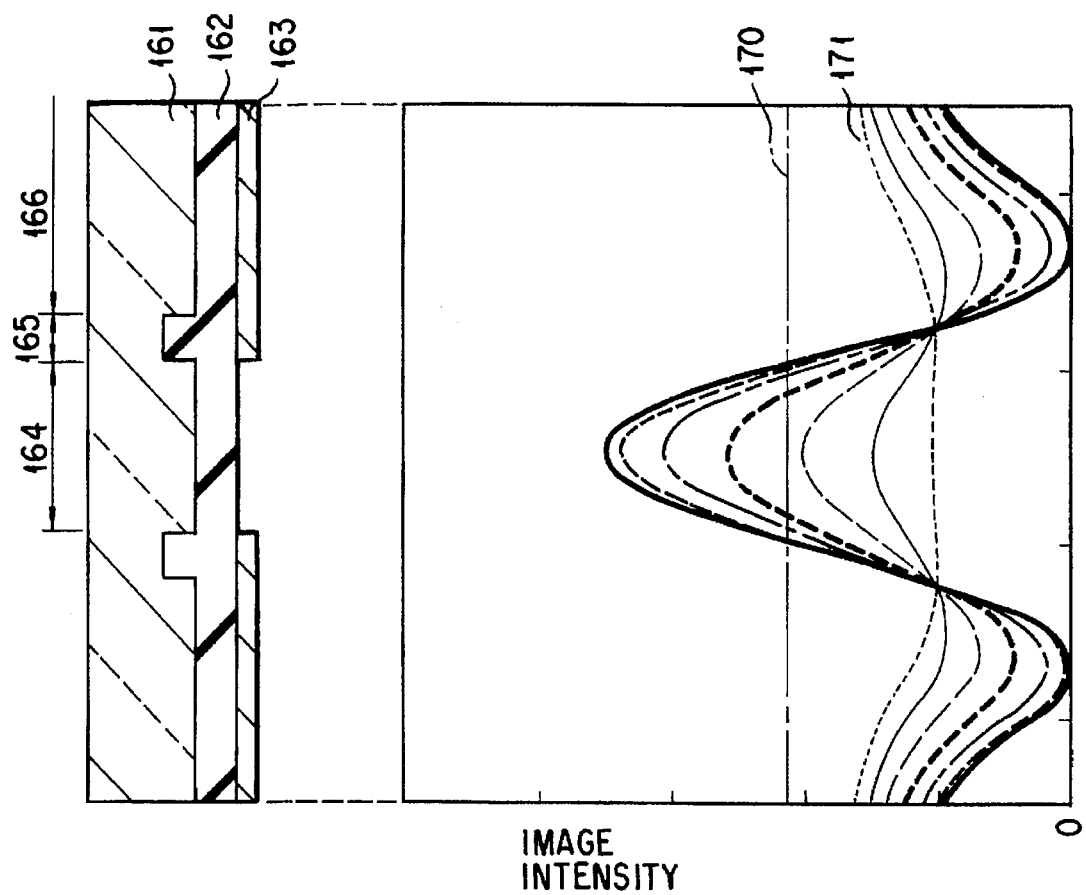
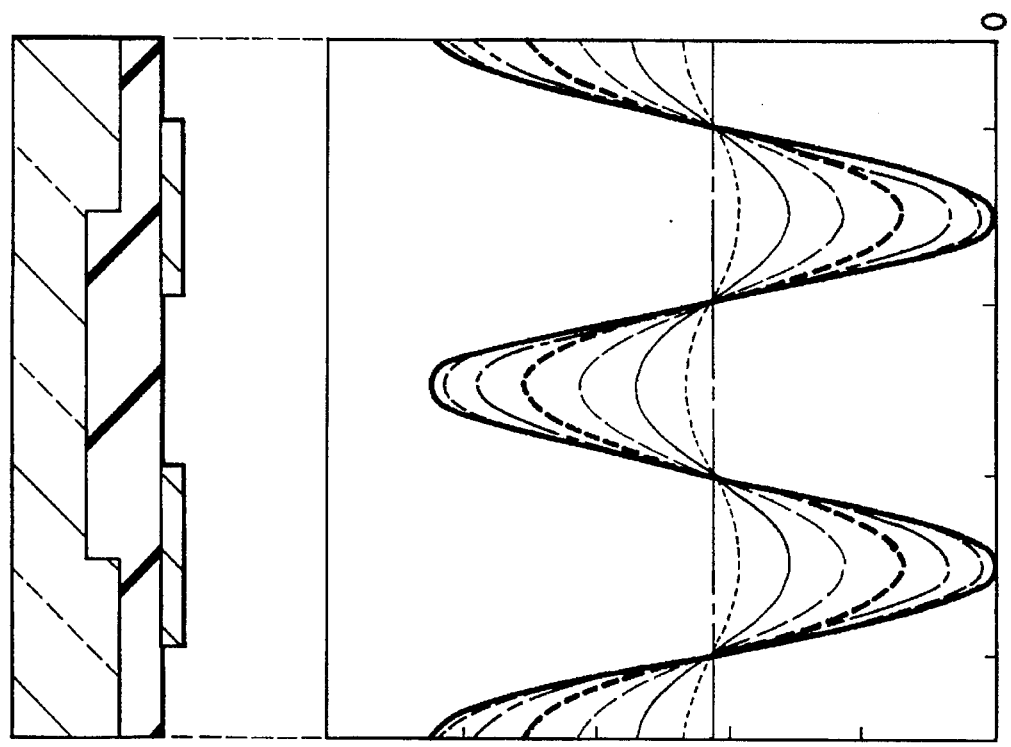

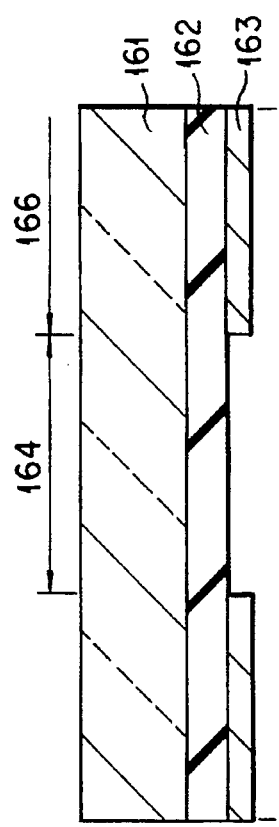
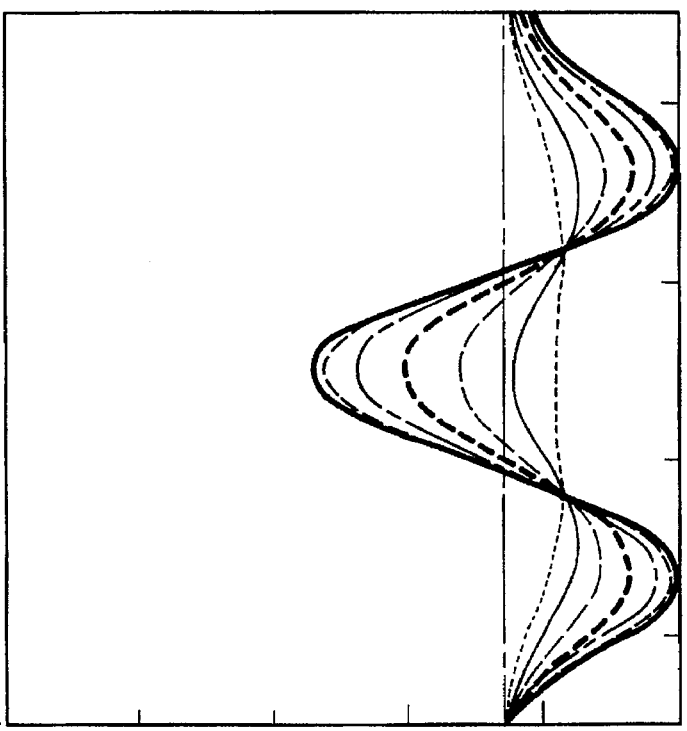
FIG. 28B
IMAGE INTENSITY
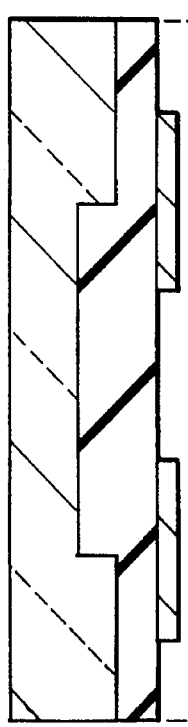
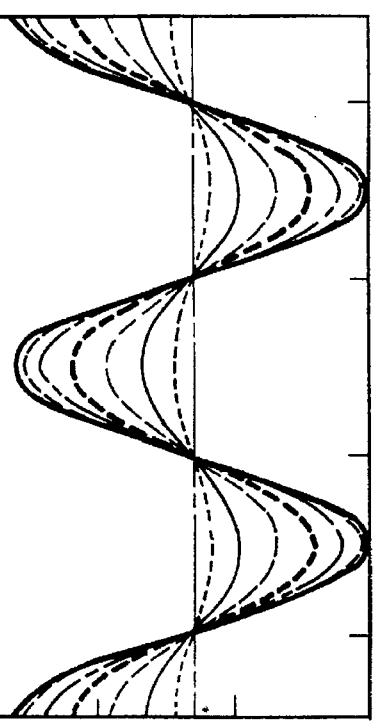
FIG. 28A

EXPOSURE MASK COMPRISING TRANSPARENT AND TRANSLUCENT PHASE SHIFT PATTERNS

CROSS-REFERENCES TO THE RELATED APPLICATIONS

This application is a continuation-in-part of U.S. patent application Ser. No. 08/377,249, filed Jan. 24, 1995, which is a Continuation-In-Part of U.S. patent application Ser. No. 08/091,357 filed Jul. 15, 1993 now U.S. Pat. No. 5,409,784. The content of these applications is relied upon and incorporated by reference.

BACKGROUND OF THE INVENTION

1. Field of the Invention

The invention relates to a mask for projection exposure to be used for lithographic process in manufacturing semiconductor devices. Still more particularly, the invention relates to a mask for exposure using a phase shifter in order to improve the resolution.

2. Description of the Related Art

Fast functioning and high integration are two remarkable features of semiconductor devices developed in recent years. Finely defined precision patterns are required for pattern exposure systems in the production of semiconductor devices having these features and rays of light having a short wavelength such as far ultraviolet rays of light are widely used for light sources that are compatible with such patterns.

However, while an increased use of KrF excimer laser involving beams oscillating at a wavelength as short as 248 nm is expected for the light source of pattern exposure systems, there have not been developed any resists that can be effectively used with laser beams. Existing resists originally designed for use with g, i lines and electron beams are among inevitable alternatives that are currently available. Resists to be used for g and i lines are based on novolac resin having a large absorption coefficient for beams with a wavelength of 248 nm and, therefore, when KrF excimer laser beams are irradiated onto a surface of a resist film of this type, they are mostly absorbed by the film as they pass through without reaching the other side. Consequently, only a surface of the resist film is exposed to the laser beam. Therefore, it is difficult to prepare a pattern having a large aspect ratio by using a resist for use with g or i lines.

A finely defined pattern may be formed by directly projecting electron beams on a resist film. However, this method of forming a pattern is accompanied by problems involving resist-heating charging-up and the through-put of pattern production and, therefore, not suited for the production of patterns on a large scale. On the other hand, while the use of radioactive rays such X-rays, electron beams or electrically charged corpuscular beams such as ion beams for producing patterns may be promising in terms of high resolution, aligners and resists that can be used with any of above mentioned beams are still to be developed.

In short, any attempts to produce finely defined patterns by using unusual light sources face problems that may not be resolved easily. In view of this fact, efforts have been made recently to provide finely defined patterns by combining a conventional light source and a newly devised technique. One of such newly developed techniques is a phase shift method, with which a phase inverting layer is provided in areas of a resist film where rays of light are allowed to pass in order to prevent adverse effects of diffracted rays of light coming from adjacent patterns and thereby improve the fineness of the projected pattern.

Of variations of the phase shift method, a so called Levenson-type phase shift method utilizes a number of phase shifters arranged in an alternate manner in light transmission zones of a mask provided with opaque patterns. The phase of rays of light that have passed the phase shifters of the mask is inverted or shifted by 180° relative to that of their counterparts that have passed through the areas of the mask where no phase shifters are disposed. In short, this method reduces interference of rays of light coming from adjacent patterns to enhance the resolution of the projected pattern by inverting the phase of rays of light passing through areas of the mask disposed adjacent to patterns.

Another variation of the phase shift method utilizes a phenomenon where dark areas are generated near the edges of a phase shifter. This technique can produce a very steep gradient in the intensity of projected light so that a finely defined space pattern may be formed when a negative type resist is used for wafer manufacturing processes. For instance, grooves having a width as small as 250 nm may be formed by using light beams having a wavelength of 365 nm for pattern alignment.

However, the above described phase shift method is not without problems. For one thing, while a Levenson-type phase shift mask shows an excellent resolution, it is subject to rigorous restrictions in terms of pattern arrangement. If a mask under consideration has a pattern arrangement as illustrated in FIG. 1 of the accompanying drawings, it may be understood that the phases of two adjacent patterns of the mask are inverted or shifted by 180° relative to each other along broken line 11 by close to each other along broken line 12. Thus, such a mask may not be particularly excellent in resolution at locations where patterns show phases that are closes to each other.

On the other hand, if the technique of utilizing dark areas generated near the edges of a phase shifter can effectively provide finely defined patterns, it cannot form large patterns. In other words, large patterns can be prepared only by using conventional opaque pattern. Therefore, while finely defined patterns may be produced for a phase shift mask by utilizing phase shifters, such a mask may not be able to operate satisfactorily because patterns having a large area of the mask are inevitably conventional light screen patterns having a relatively poor resolution.

Thus, on the one hand, a conventional Levenson-type phase shift mask is accompanied by a disadvantage that adjacent patterns can have phases that are identical with each other to the detriment of the achievable resolution. On the other hand, the technique of utilizing dark area near the edges of e phase shifter does not address the problem of improving the resolution of a mask in the areas of the large patterns it comprises.

SUMMARY OF THE INVENTION

In view of the above described circumstances, it is therefore an object of the present invention to provide an exposure mask capable of producing a phase shift effect in areas of the mask where adjacent patterns have phases identical to each other and large patterns are disposed in order to enhance the overall resolution of the mask.

According to a first aspect of the present invention, the above object is achieved by providing an exposure mask comprising mask patterns arranged on a light transmitting substrate characterized in that the mask patterns are constituted by translucent phase shift patterns arranged on unexposed areas of the substrate and transparent phase shift patterns arranged on exposed areas of the substrate, the translucent phase shift patterns having a phase shifted by a given extent from that of transparent phase shift patterns.

According to a second aspect of the invention, there is provided an exposure mask comprising translucent phase shift patterns and transparent phase shift patterns characterized in that the phase shift patterns show a double layer structure at and near the edges of each of them and that each of the translucent phase shift patterns is laid on one of the transparent phase shift patterns at an edge thereof.

According to a third aspect of the invention, there is provided an exposure mask characterized in that it comprises a transparent substrate capable of transmitting exposure light, transparent phase shift areas formed by burying a material showing a refractive index different from that of the substrate relative to exposure light on a surface of or inside the transparent substrate in such as manner that the areas does not disturb the planar surface of the substrate and translucent phase shift patterns formed on respective planarized areas of the transparent substrate so as to cover the boundaries of the transparent phase shift areas.

According to a fourth aspect of the invention, there is provided an exposure mask characterized in that it comprises a transparent substrate capable of transmitting exposure light, transparent phase shift areas formed by engraving part of the surface of the transparent substrate and providing light paths differentiated from the corresponding light paths of the substrate with regard to the wavelength of exposure light, a transparent plate formed on the transparent substrate to completely close the transparent phase shift areas and translucent phase shift patterns formed on the transparent plate so as to cover the boundaries of the transparent phase shift areas.

According to a fifth aspect of the invention, there is provided an exposure mask characterized in that the exposure mask is formed by providing a mask pattern comprising a transparent phase shift pattern and a translucent phase shift pattern on a light-transmissive substrate, each of said transparent phase shift pattern and said translucent phase shift pattern causes a relative phase difference of 180° to exposure light passing through each of said transparent phase shift pattern against exposure light passing through said light-transmissive substrate and said translucent phase shift pattern, said transparent phase shift pattern and said translucent phase shift pattern partly overlap each other, at least one opening portion in the mask pattern has at an adjacent region an overlap region of said transparent phase shift pattern and said translucent phase shift pattern region, and a region of said translucent phase shift pattern is provided on the outside of said overlap region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic partial view of a conventional exposure mask comprising patterns provided with a phase shifter and those with no phase shifter;

FIG. 2A is a schematic sectional partial view of a conventional Levenson-type mask;

FIG. 2B is a graph showing the light amplitude distribution of the Levenson-type mask of FIG. 2A;

FIG. 2C is a graph showing the light intensity distribution of the Levenson-type mask of FIG. 2A;

FIGS. 3B, 5B and 6B are graphs respectively showing the light amplitude distributions of the Levenson and half tone type masks of FIGS. 3A, 5A and 6A;

FIGS. 3C, 5C and 6C are graphs respectively showing the light intensity distributions of the Levenson and half tone-type masks of FIGS. 3A, 5A and 6A;

FIGS. 7A through 7C are views illustrating for comparison a conventional Levenson and half tone-type mask and a mask according to the third and fourth aspects of the invention;

FIG. 16 is a graph, showing the relationship between a focal latitude and the ratio of a space width to a pitch width.

FIGS. 18A and 18B show cross-sections and image intensities of a periodic pattern and an isolated pattern in the case where an exposure mask according to Example 16 of the present invention was used;

FIGS. 28A and 28B show cross-sections and image intensities of a periodic pattern and an isolated pattern in the case where the exposure mask according to Example 16 of the invention was used.

DETAILED DESCRIPTION OF THE PREFERRED EMBODIMENTS

Figure 3A:
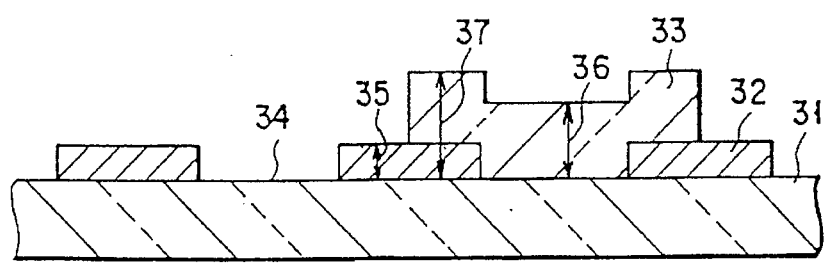
FIGS. 3A, 5A, and 6A to 6D are schematic sectional partial views of so many different Levenson and half tone (Attenuated)-type masks according to the invention.

Some of the advantageous features of an exposure mask according to the present invention include the followings.

(1) The phase shift areas have a phase shifted by (90×m)±10° or (120×n)±10° (where m and n are integers equal to or greater than 1) from that of the remaining areas.

(2) The translucent phase shift patterns have a phase shifted by {180×(2L+1)}±10° (where L is an integer) from that of exposure light passing through the related alignment media having a same thickness.

(3) The entire exposure areas of the transparent substrate are covered by a material having a refractive index different from that of the substrate to form a film having a thickness of h.

(4) The film thickness h is so determined that the intensity of light passing through the phase shift areas is equal to that of light passing through the areas other than the phase shift areas after multiple reflections.

(5) The translucent phase shift patterns have an amplitude transmissivity of 20±15% relative to exposure light passing through the related exposure media having a same thickness.

(6) Each of the translucent phase shift patterns comprises a single translucent film layer or a multilayer structure having a translucent film layer and a transparent film layer.

(7) An opaque film having an amplitude transmissivity of not greater than 5% is disposed along the boundary of any exposure area and an adjacent unexposure area of the mask.

An exposure mask according to the invention may preferably be prepared by either of the following methods.

(1) A method comprising steps of engraving a recessed pattern on part of a transparent substrate, subsequently forming transparent phase shift areas by depositing a transparent material showing a refractive index different from that of the transparent substrate relative to exposure light at least on the recessed pattern, thereafter smoothing surface areas of the substrate including those for printing, then forming a translucent phase shift film on at least part of the smoothed areas of the substrate and partly removing the translucent phase shift film in such a manner that the translucent phase shift film may partly remain along the boundaries of the transparent phase shift areas.

(2) A method comprising steps of engraving a recessed pattern on part of a transparent substrate, subsequently forming transparent phase shift areas by arranging a transparent plate on the substrate and planarizing the surface of the substrate, then forming translucent phase shift film on the entire surface or a part of the surface of the transparent plate and partly removing the translucent phase shift film in such a manner that the translucent phase shift film may at least partly remain along the boundaries of the transparent phase shift areas.

Preferably the step of planarizing the surface of the substrate including the boundaries of the transparent phase shift areas comprises an operation of removing by polishing any projections that may be found on the surface of the substrate. Still preferably, the step of planarizing the surface of the substrate including the boundaries of the transparent phase shift areas comprises an operation of applying a fluid material on the surface of the substrate, smoothing the surface and thereafter removing projections that may be found on the surface by unselective etching (etching performed under a condition which an etching rate of the substrate is equal to that of the fluid material).

Preferably, the surface of the translucent transparent patterns is forcibly oxidized. Still preferably, the above methods further comprise a step of forming an opaque film instead of a translucent phase shift film. Still preferably, each of the boundaries of the transparent phase shift areas forms at least partly an equidistant line with regard to adjacent two edges of the related translucent phase shift patterns or opaque films.

Some of the characteristics features of an exposure mask according to the invention will be described below.

FIG. 2A is a schematic sectional partial view of a conventional Levenson-type exposure mask.

Opaque patterns 22 are arranged on the surface of a transparent substrate 21 and a transparent phase shift pattern 23 is formed on each transparent area separating two adjacent opaque patterns 22 in such a manner that it partly covers the opaque patterns 22. The amplitude of light passing through the mask will show a distribution curve as illustrated in FIG. 2B. FIG. 2C is a distribution curve of the intensity of light at the bottom of the mask, representing the resolution of the mask. In an exposure mask according to the invention, the opaque patterns of a Levenson-type mask are replaced by translucent phase shift patterns. In other words, an exposure mask according to the invention is realized by coordinating a Levenson-type mask and a half-tone-type mask. With such an arrangement, the resolution of any adjacent transparent areas having an identical phase will be improved by the phase shift effect of the translucent areas and hence the depth of focus of the mask will be increased.

FIG. 3A is a schematic sectional partial view of a mask according to the invention, which is an improved Levenson-type mask where translucent phase shift patterns and transparent phase shift patterns formed by anisotropic deposition are arranged in a coordinated manner. This mask is realized by arranging translucent phase shift patterns 32 that correspond to areas not exposed to light irradiation of a wafer (unexposed areas) on a transparent substrate 31 and forming a transparent phase shift pattern 33 on each transparent area separating two adjacent translucent phase shift patterns 32 in such a manner that the transparent pattern 33 partly covers the translucent patterns 32. The translucent phase shift patterns 32 and the transparent phase shift patterns 33 have a phase shifted by 180° relative to that of the substrate 31.

Now, when the phase of light passing through each of the areas of the mask is observed, assuming that the rays of light that have passed through exposed areas of the substrate 31 have a phase of 0°, the rays of light that have passed through the areas 35 carrying only a translucent phase shift pattern 32 and those that have passed through the areas 36 carrying only a transparent phase shift pattern will show a phase shifted by 180° from that of the above described rays of light. On the other hand, the rays or light that have passed through the areas 37 carrying both a translucent phase shift pattern 32 and a transparent phase shift pattern 33 as a double layer structure will show a phase shifted by 180° multiplied by two, or 360°.

Thus, if no phase shifter is arranged on either of two adjacent transparent section or a phase shifter is disposed on both of two adjacent transparent sections, the phases of the rays of light that have passed through adjacent light paths (34–35, 35–37, 37–36) will always show a shift of 180° relative to each other.

Figure 3B:
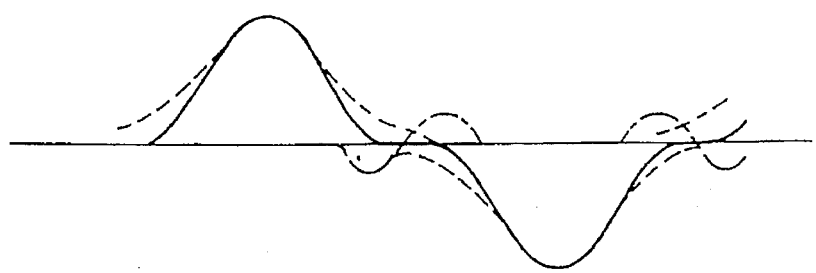
Figure 3C:
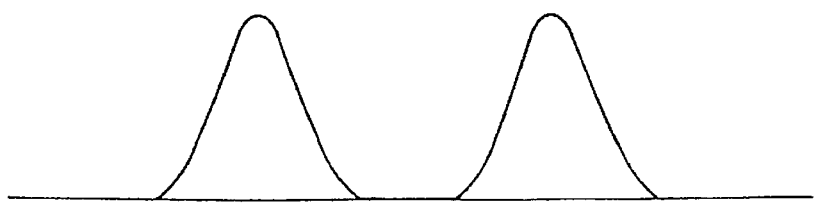

In other words, with an exposure mask comprising translucent phase shift patterns 32 and transparent phase shift patterns 33 which are arranged in a manner as described above, the phase shift effect is observed in each of the patterns. FIG. 3B shows the distribution of amplitude of light at the bottom of the mask of FIG. 3A. In FIG. 3B, the dotted line represents the distribution of amplitude of the rays of light that have passed through a transparent phase shift pattern 33, whereas the broken line represents the distribution of amplitude of the rays of light that have passed through a translucent phase shift pattern 32, the solid line representing the synthesized effect of the patterns 32 and 33 on the amplitude of light passing though the mask. FIG. 3C shows the distribution of light intensity obtained by squaring the values of the amplitude of FIG. 3B. It will be seen by comparing the performance of a conventional Levenson-type phase shift mask with that of a mask according to the invention that the latter provides a better pattern separation and an improved light intensity profile.

What needs to be stressed here is that a double layer structure of a transparent phase shift pattern layer 33 and a translucent phase shift pattern layer 32 appears at and near each of the edges of the translucent phase shift patterns 32 having an adjacent transparent phase shift pattern 33. The double layer structure is essential to realize a phase shift of 180° for adjacent transparent areas of all patterns.

Figure 4A:
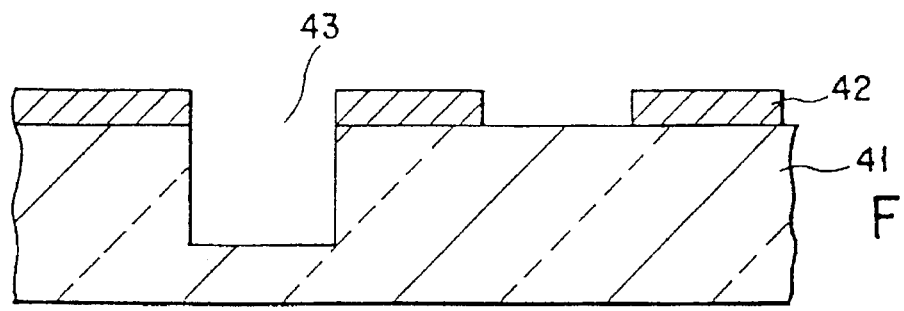
FIG. 4A is a schematic sectional partial view of a Levenson and half tone-type mask according to the invention realized by engraving a transparent substrate to form transparent phase shift patterns.
Figure 4B:
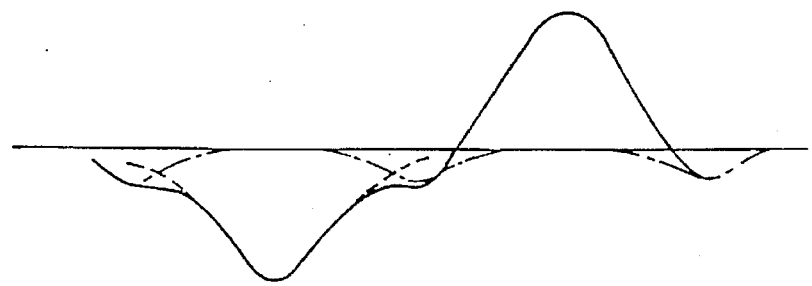
FIG. 4B is a graph showing the light amplitude distribution of the Levenson and half tone-type mask of FIG. 4A.
Figure 4C:
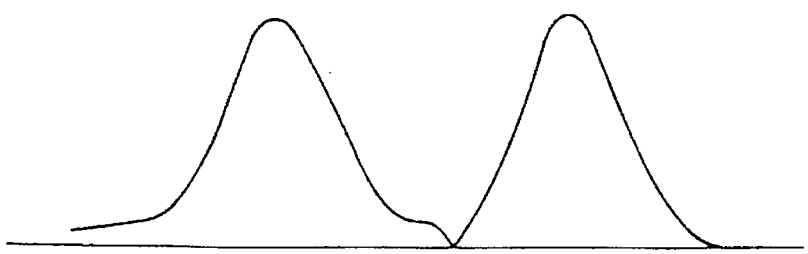
FIG. 4C is a graph showing the light intensity distribution of the Levenson and half tone-type mask of FIG. 4A.

FIG. 4A is a schematic sectional partial view of another exposure mask according to the invention comprising transparent phase shift patterns formed by engraving a transparent substrate. Here, each of the engraved areas shows a phase shift of 360° relative to adjacent translucent phase shift patterns and the light intensity profile of such a mask in not as neat as that of the mask of FIG. 3A as clearly seen by comparing FIGS. 3B and 3C respectively with FIGS. 4B and 4C and, therefore, the exposure mask of FIG. 4A is relatively poor in performance. reference numerals 41, 42 and 43 in FIG. 4A respectively denotes a transparent substrate, translucent phase shift patterns and grooves cut into the substrate.

Figure 5A:
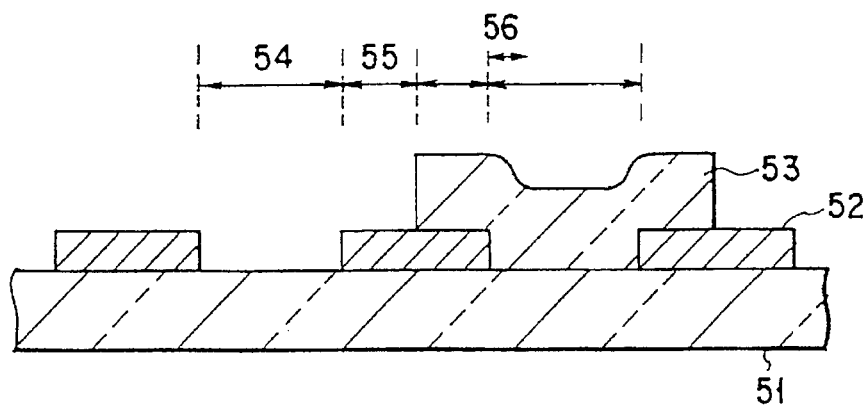
Figure 5B:
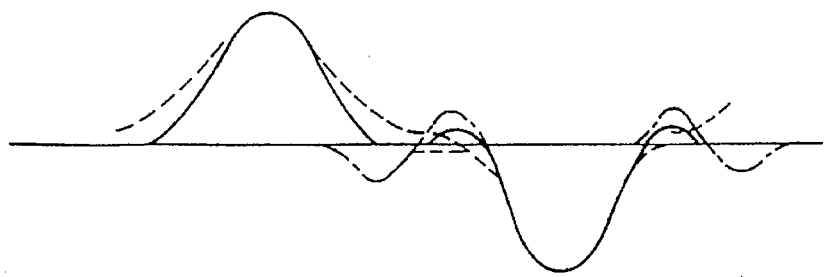

In FIG. 5A showing another mask according to the invention and comprising transparent phase shift patterns formed by an isotropic technique, each of the transparent phase shift patterns 53 is riding on and near the oppositely disposed edges of adjacent translucent phase shift patterns 52. With such an arrangement, the phase of the transparent phase shift patterns is shifted at 56 where the level of the transparent phase shift patterns 53 is raised by a value that corresponds to the difference of level. If, for instance, i beams are used for exposure, the film thickness of the transparent phase shift patterns will be 388.2 nm at 56, assuming that their refractive index is equal to 1.47. On the other hand, the film thickness of the translucent phase shift patterns 52 will be 80 nm. Thus, the level of the transparent phase shift patterns will be raised at the edges of the translucent phase shift patterns by 80 nm from the lower level of the transparent phase shift patterns which stands 388.2 nm from surface of the substrate. Consequently, the phase of the transparent phase shift patterns is shifted excessively by 37° so that a phase difference that continuously varies from 180° to 217° will be generated.

Figure 5C:
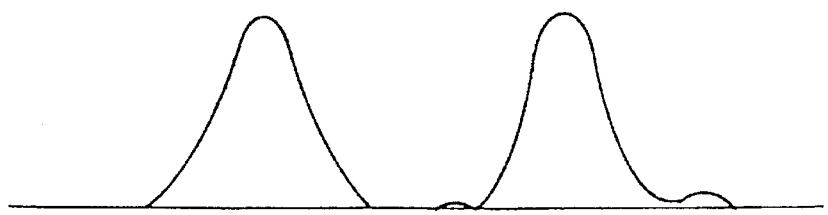

Then, the light intensity distribution (FIG. 5C) for such a mask will show a narrow bandwidth at areas 55 that correspond to transparent phase shift patterns 53 as compared with the bandwidth at areas 54 that correspond to the exposed areas of the substrate 51 and the edges of the transparent phase shift patterns 53 may relatively easily maintain a high light intensity level at and near their edges. All these problems serve to reduce the resolution and the depth of focus of the mask.

Figure 6A:
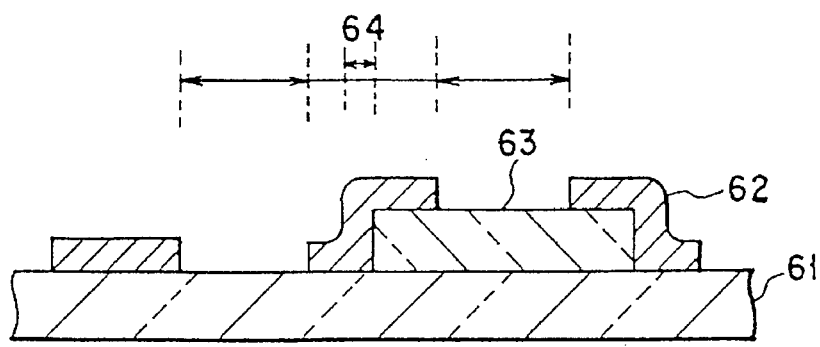
Figure 6B:
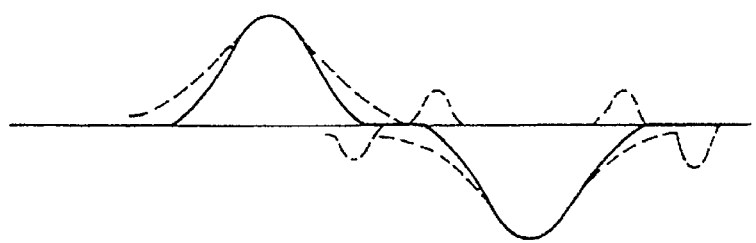
Figure 6C:
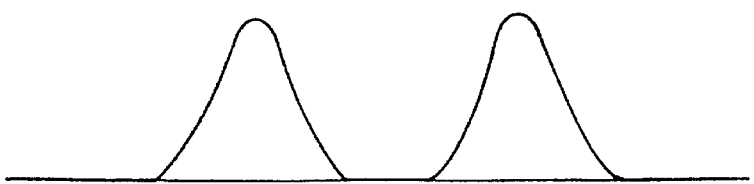
Figure 6D:
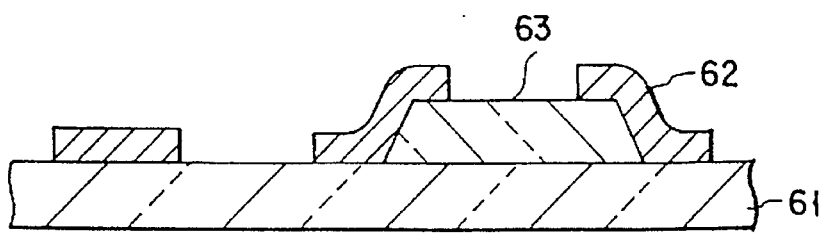

These problems, however, can be resolved by structures as shown respectively in FIGS. 6A and 6D. In the structure of FIG. 6A, a pair of translucent phase shift patterns 62 are laid on a translucent phase shift pattern 63 to avoid the problem of translucent phase shift patterns 63 riding on translucent phase shift patterns 62. Thus, the phase of rays of light passing through the mask is shifted by either 0° or 180° to fully exploit the phase shift effect of the transparent phase shift patterns 63. (See FIGS. 6B and 6C).

Additionally, in the structure of FIG. 6A, the phase of the translucent phase shift patterns 62 is shifted by a value that correspond to the difference of level of the transparent phase shift patterns 63 as the latter are partly raised at locations 64. But, the effect of this phase shift is not practically exhibited by the fact that the translucent phase shift patterns almost lose their light transmissivity to become almost opaque at locations 64 because of the increase in the overall film thickness at those locations.

It should be noted here that the phase shift of the translucent phase shift patterns has an effect of eliminating any interference of rays of light between adjacent transparent phase shift patterns that shows a phase shift of 180° at the pattern edges. Therefore, the existence of an opaque area at the center of each of the translucent phase shift pattern does not adversely affect the phase shift effect of the translucent phase shift patterns.

A mask having e configuration as shown in FIG. 6A may be prepared in a manner as described below.

Firstly, patterns are formed by partly etching a transparent substrate to engrave patterns on the substrate so that they may show a phase shifted by 180° relative to that of the substrate. Thereafter, a transparent phase shift film is evenly formed on the substrate and subsequently transparent phase shift patterns are formed there either by partly etching it or by using a selective growth technique. Then, a translucent phase shift film is formed on the entire surface of the substrate and thereafter translucent phase shift patterns are produced either by partly removing the film or by selectively depositing an additional translucent phase shift film on the already formed translucent phase shift film.

Note that the lateral walls of the transparent phase shift patterns 63 are perpendicular to the surface of the substrate 61, they may alternatively be inclined relative to the surface of the substrate 61 as shown in FIG. 6D.

When a translucent phase shift film having a transmissivity not smaller than 2% is used for an exposure mask of FIG. 6A or 6C, the areas of the substrate surface other than the pattern areas may preferably be covered by an opaque film of a material such as chromium (Cr). This is because, when such a translucent phase shift film is used, rays of light that have passed though the translucent phase shift film may irradiate the areas of the substrate surface other than the pattern areas to degrade the contours of the pattern and such degradation may be prevented by providing opaque films that protect the areas of the substrate surface other than the pattern areas against irradiation.

Now, the difference between a conventional Levenson-type exposure mask and an exposure mask according to the third and fourth aspect of the invention will be described by referring to FIGS. 7A through 7C. FIG. 7A shows a sectional view of a convention Levenson-type mask and that of a mask according to the invention, while FIG. 7B shows graphs of their respective amplitude distributions and FIG. 7C illustrates graphs of their respective intensity distributions. Note that the Levenson-type exposure mask of FIG. 7A has configuration similar to that of the mask according to the invention.

There has not been known any Levenson-type exposure mask where each of the boundaries of its phase shift areas is at least partly located along an equidistant line of two adjacent edges of the related translucent phase shift patterns. There has not been known any Levenson-type exposure mask where the boundaries of its phase shift areas is located away from the opaque film in the direction of an optical axis.

With a conventional Levenson-type exposure mask, pattern separation having a negative interference effect 71 on pattern edges can be realized at 73 by arranging phase shift areas in a zigzag manner on orifices of repeated patterns. But, only a less remarkable effect achievable for a mask carrying only opaque films can be realized for isolated patterns as shown at 73a.

Contrary to this, with an exposure mask according to the invention, a same phase shift effect can be exerted on both repeated patterns and isolated patterns by installing translucent phase shift films 75 in place of conventional opaque films 76. On repeated patterns, not only a negative interference effect obtainable in a Levenson-type mask but also a negative interference effect 72 obtainable between a transparent phase shift area and a translucent phase shift area area present so that there can be realized a steep gradient in the rise or fall of light intensity 74 at edges of repeated patterns to be formed as opaque patterns on a wafer. Additionally, the inherent effect 74a of translucent phase shift patterns can be fully exerted to produce a favorable depth of focus for isolated patterns.

For an exposure mask according to the third and/or fourth aspects of the invention, it is necessary to provide a relative phase difference of 180° for any two adjacent ones of the patterns that the mask comprises and, in order to achieve this, each of the boundaries of its phase shift areas is at least partly located along an equidistant line of two adjacent edges of the related translucent phase shift patterns or the opaque films. If, for instance, each of the transparent phase shift areas of the mask is disposed side by side near a corresponding translucent phase shift pattern but they do not form a multilayer structure or if each of the transparent phase shift patterns is formed by engraving an area of the substrate separating two adjacent translucent phase shift patterns, the transparent phase shift patterns will show a phase shifted by 360° from that of the translucent phase shift patterns to produce no phase shift effect.

Now, some of the requirements of an exposure mask according to the third and/or fourth aspect of the invention will be described below.

When recesses are formed on a transparent substrate by etching, the recesses are required to have a depth t greater than T which is a function of the desired phase difference $\Delta\phi$, where T is expressed by formula 1 below.

$$T = \lambda \times \Delta\phi / 360 |n_1 - n_2| \qquad (1)$$

where $\lambda$ is the wavelength of exposure light, $n_1$ is the refractive index of the substrate relative to exposure light, $n_2$ is the refractive index of the substance to fill the recesses and $\Delta\phi$ is the relative phase difference generated between the filling substance and the remaining areas of the mask. The substance to fill the recesses may be liquid or gas such as air.

Now, the recesses are filled by the substance having a refractive index of $n_2$ relative to exposure light. At this stage, the height to which the recesses are filled needs to be equal to or greater than T. The relationship between t and T needs to be expressed by either formula (2) or formula (3) below.

$$t > T \qquad (2)$$

In this case, a transparent substrate having a planar surface and capable of generating the desired phase difference can be prepared by scraping the exposure areas of the substrate by t–T after filling the recesses with a substance having a refractive index of $n_2$ relative to exposure light.

$$t = T \qquad (3)$$

In this case, the extent to which the exposure areas of the substrate is scraped may take any value if the surface of the substrate is kept planar in the exposure areas and the substrate itself is not scraped.

Now, it is possible to form a film on all the exposure areas of the transparent by deposition and produce an exposure mask showing no difference in the rate of transmission of light throughout the exposure areas by scraping the deposited films, taking multiple reflections into account, so that the intensity of transmitted light may be identical at any point of the bottom of the substrate regardless of the phase shift areas and the remaining areas. Differently stated, the light transmission media may have an identical history for rays of light passing through the recessed areas 77 and those passing through the projected areas 78. In other words, both rays of light passing through the recessed areas 77 and those passing through the projected areas 78 eventually reach the respective translucent phase shift films 75 after having been transmitted through the substrate and the respective deposited films. With such an arrangement of making the media have an identical history, an exposure mask showing no difference in the rate of transmission of light can be obtained.

It should be noted here that, if the recesses are filled with a liquid or a gas having a refractive index of $n_2$, the relationship between to and h need to satisfy formula 3 above. Additionally, the surface of the substrate needs to be covered by a transparent plate in order to prevent the substance having a refractive index of $n_2$ from flowing out when the exposure mask is installed in an exposure apparatus. The material to be used for the transparent plate may be the same as or different from the transparent substrate. Some of the materials that may be used for the transparent plate include $SiO_2$, $Al_2O_3$, $MgF_2$ and $CaF_2$.

In order to provide an optimum phase relationship between the translucent phase shift patterns and the phase shift areas of an exposure mask according to the invention, it is preferable that each of the boundaries of its phase shift areas is at least partly located along an equidistant line of two adjacent edges of the related translucent phase shift patterns or the opaque films.

Now, the present invention will be described further on by way of examples.

Example 1

In this example, an exposure mask for sue with KrF excimer laser was prepared.

Figure 8A:
FIGS. 8A through 8G are sectional vies of an exposure mask according to the invention and used in Example 1 as described hereinafter, showing so may different steps for preparing it.

Firstly, as shown in FIG. 8A, an SiNα ($0.8<\alpha<1.2$) film (translucent film) 82 was formed as a translucent film to a thickness of 75 nm on an $SiO_2$ transparent substrate 81 designed for alignment purposes by sputtering in a nitrogen atmosphere, using silicon as target, while appropriately controlling the nitrogen concentration relative to silicon. The film showed a phase difference of 180° and an amplitude transmissivity of 19.6% to exposure light.

Figure 8B:
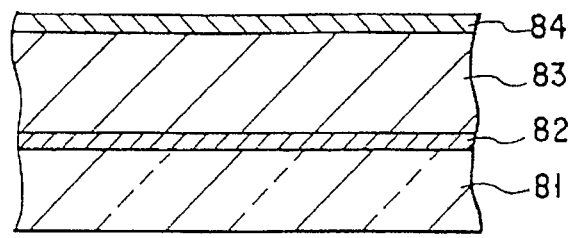
Figure 8C:
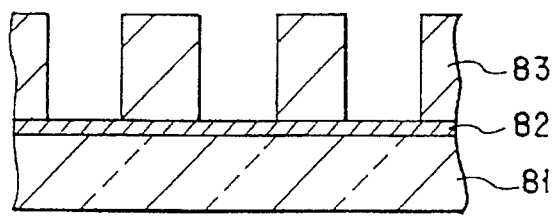
Figure 8D:
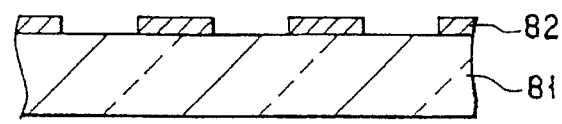

Thereafter, as shown in FIG. 8B, a resist 83 was applied to the SiNα film 82 to a thickness of 1.0 μm and then a conductive film 84 was formed by application of a conductive material to a thickness of 0.2 μm. Subsequently, as shown in FIG. 8C, the conductive film was exposed to light at a rate of 6 μC/cm² and resist patterns were produced by photographically developing the exposed film. Then, as illustrated in FIG. 8D, the exposed areas of the translucent film 82 were removed by using the pattern carrying resist as a mask. Thereafter, the resist 83 was peeled off to produce translucent phase shift patterns.

Figure 8E:
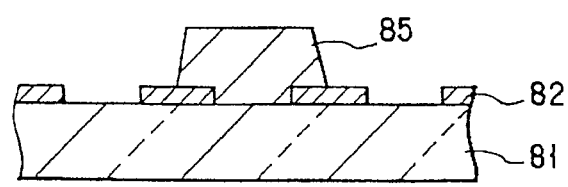

Then, as shown in FIG. 8E, an electron beam resist 85 was applied to the obtained transparent substrate for alignment to a thickness of 1.0 μm and thereafter a transparent conductive film (not shown) was formed to a thickness of 0.2 μm. Subsequently, the film was exposed to light at a rate of 6 μC/cm² and resist patterns were produced by photographically developing the exposed film.

Figure 8F:
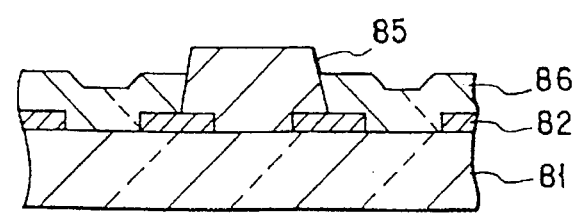
Figure 8G:
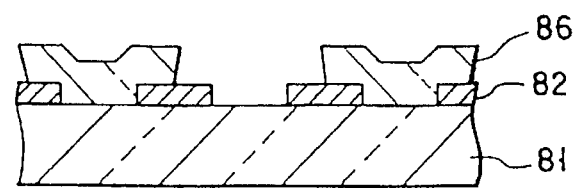

Then, as shown in FIG. 8F, an $SiO_2$ film (transparent film) 86 was selectively formed by deposition on the exposed areas of the $SiO_2$ transparent alignment substrate 81. Thereafter, as shown in FIG. 8G, transparent phase shift patterns were formed by removing the resist 85. At this stage, the deposited film has a thickness of 248 nm and showed a phase shifted by 180° relative to that of the areas of the film carrying no transparent phase shift pattern.

When, for the purpose of comparison, a resist for KrF excimer layer available from Shipley Corporation under the tradename of SNR was used to form a film to thickness of 1.0 μm, which was then exposed to light, for a conventional Levenson-type phase shift mask comprising opaque patterns to a thickness of 0.3 μm and phase shifter films for a phase shift between 0° and 180° C., the mask showed a depth of focus of 1.0 μm when any two adjacent patterns had phases inverted relative to each other but did not provided a required dimensional accuracy through it showed a satisfactory resolution so long as no phase shift was involved.

Contrary to this, when the exposure mask of this example was exposed to light, it showed a depth of focus of 1.5 μm at adjacent areas having phases inverted relative to each other and 0.3 μm at adjacent areas having an identical phase.

While SiNα was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to $SiO_2$ and may be formed by using a substance having a transmissivity of not less than 95% to light to which it is exposed such as $Si_3N_4$, $CaF_2$ or $MgF_2$. The method of preparing an exposure mask described for the above example may be used with beams of other than KrF exposure wavelength such as g line, i line of a mercury lamp, or beams having other wavelengths.

Example 2

An exposure mask was prepared by the method described for Example 1 above so that patterns may be produced at the edges of its transparent phase shift patterns.

When, for the purpose of comparison, a resist available from Shipley Corporation under the tradename of SNR was used to form a film to a thickness of 1.0 μm, which was the exposed to light, for a conventional mask comprising opaque patterns and phase shifter films for a phase shift between 0° and 180°, 0.25 μm patterns formed by using the edge sections of the transparent phase shift patterns showed a depth of focus of 1.25 μm. 0.4 μm patterns realized by using the opaque areas showed a depth of focus of 0.2 μm.

Contrary to this, when the exposure mask of this example comprising translucent phase shift patterns and transparent phase shift patterns was exposed to light, 0.4 μm patterns formed by using the translucent phase shift patterns showed a remarkably increased depth of 0.8 μm although 0.25 μm patterns produced by using the edge sections showed a depth of focus of 1.2 μm comparable to the corresponding patterns of a conventional mask.

Example 3

In this example, an exposure mask for use with a KrF excimer lass was prepared.

Firstly, as described above for Example 1, an SiNα film was formed as a translucent film to a thickness of 75 nm on an $SiO_2$ transparent substrate designed for alignment purposes by sputtering in a nitrogen atmosphere, using silicon as target, while appropriately controlling the nitrogen concentration relative to silicon. The film showed phase difference of 180° and an amplitude transmissivity of 19.6% to exposure light.

Thereafter, a resist was applied to the film to a thickness of 1.0 μm and then a conductive film was formed by application of a conductive material to a thickness of 0.2 μm. Subsequently, the conductive film was exposed to light at a rate of 6 μC/cm² and resist patterns were produced by photographically developing the exposed film. Then, the exposed areas of the translucent were removed by using the pattern carrying resist as a mask. Thereafter, the resist was peeled off to produce translucent phase shift patterns. Subsequently an $SiO_2$ layer was formed on the entire surface of the substrate by a CVD technique.

Then, an electron beam resist was applied to the obtained transparent substrate for alignment to a thickness of 1.0 μm and thereafter a transparent conductive film was formed to a thickness of 0.2 μm. Subsequently, the film was exposed to light at a rate of 6 μC/cm² and resist patterns were produced by photographically developing the exposed film. Following to this, the exposed CVD-SiO₂ film was removed by etching. Thereafter, transparent phase shift patterns were formed by removing the resist. At this state, the deposited film has a thickness of 248 nm and showed a phase shifted by 180° relative to that of the areas of the film carrying no transparent phase shift pattern.

When, for the purpose of comparison, a resist for a KrF excimer laser available from Shipley Corporation under the tradename of SNR was used to form a film to a thickness of 1.0 µm, which was then exposed to light, for a conventional Levenson-type phase shift mask comprising opaque patterns to a thickness of 0.3 µm and phase shifter films for a phase shift between 0 and 180°, the mask showed a depth of focus of 1.0 µm when any two adjacent patterns had phases inverted relative to each other hut did not provided a required dimensional accuracy though it showed a satisfactory resolution so long as no phase shift was involved.

Contrary to this, when the projection exposure mask of this examples was exposed to light, it showed a depth of focus of 1.5 µm at adjacent areas having phases inverted relative to each other and 0.3 µm at adjacent areas having an identical phase.

Preferably, each of the translucent phase shift patterns is made of silicon, germanium, gallium arsenide, titan, aluminum, chrome, tin, indium, nickel, cobalt, tantalum, hafnium; or of oxides, nitrides, hydrates, carbides, or harides of these materials could be used; or of mixtures of any of the materials.

Further, the translucent phase shift pattern may be made of an oxide, a nitride, a hydrate, a carbide or haride of a metal silicide. In this case, the metal silicide may consist of molybdenum silicide, nickel silicide, copper silicide, copper aluminum silicide, chrome silicide, indium silicide, etc. In particular, molybdenum silicide and chrome silicide have advantages that they have a desired phase difference and transmittance at the wavelength of the exposure light, and have a low transmittance even at a wavelength longer than 365 nm used in an inspection device for inspecting the exposure mask. Moreover, among the harides, fluorides are optimal materials for the translucent phase shift patterns.

The material of the transparent phase shift film is not limited to SiO₂ and may be formed by using a substance having a transmissivity of not less than 95% to light to which it is exposed such as CaF₂ or MgF₂. The method of preparing an exposure mask described for the above example may be used with beams of other than KrF exposure wavelength as g line, i line of a mercury lamp, KrF or beams having other wavelength.

Example 4

In this example, an exposure mask for use with i line of a mercury lamp was prepared.

Firstly, an SiNβ (0.5<β<0.8) film was formed as a translucent film to a thickness of 65 nm on an SiO₂ transparent substrate designed for alignment purposes by sputtering in a nitrogen atmosphere, using silicon as target, while appropriately controlling the nitrogen concentration relative to silicon. The film showed a phase difference of 180° and an amplitude transmissivity of 18% to exposure light.

Thereafter, a resist was applied to the film to a thickness of 1.0 µm and then a transparent conductive film was formed by application of a conductive material to a thickness of 0.2 µm. Subsequently, the conductive film was exposed to light at a rate of 6 µC/cm² and resist patterns were produced by photographically developing the exposed film. Then, the exposed areas of the translucent were removed by using the pattern carrying resist as a mask. Thereafter, the resist was peeled off to produce translucent phase shift patterns.

Then, a resist designed for use with electron beams was applied to the obtained transparent substrate for alignment to a thickness of 1.0 µm and thereafter a transparent conductive film was formed by application to a thickness of 0.2 µm. Subsequently, the film was exposed to light at a rate of 6 µC/cm² and resist patterns were produced by photographically developing the exposed film. Following to this, an SiO₂ film was selectively formed on the exposed areas of the SiO₂transparent substrate for alignment in a liquid phase and the resist was removed to produce transparent phase shift patterns. At this stage, the deposited film has a thickness of 425 nm and showed a phase shifted by 180° relative to that of the areas of the film carrying no transparent phase shift pattern.

When, for the purpose of comparison, PFR-IX500 resist (tradename, available from Japan Synthetic Rubber Co., Ltd.) was used to form a film to a thickness of 1.2 µm, which was then exposed to light, for a conventional Levenson-type phase shift mask comprising opaque patterns to a thickness of 0.35 µm and phase shifter films for a phase shift between 0° and 180°, the mask showed a depth of focus of 1.0 µm when any two adjacent patterns had phases inverted relative to each other but did not provide a required dimensional accuracy through it showed a satisfactory resolution so long as no phase shift was involved.

Contrary to this, when the projection exposure mask of this examples was exposed to light, it showed a depth of focus of 1.0 µm at adjacent areas having phases inverted relative to each other and 0.6 µm at adjacent areas having an identical phase to prove a remarkable improvement for the overall depth of focus.

While SiNβ was used for a translucent phase shift film in the above example, a substance selected from silicon, germanium, gallium arsenide, titanium, aluminum, chromium, tin, indium, nickel, cobalt, tantalum, metals other then those listed above, nitrides, oxides, hydrides, carbides and halogenides of the above metals and mixtures of any of them. The amplitude transmissivity of the translucent phase shift film may be appropriately adjusted to a value between 10 and 30%.

The material of the transparent phase shift film is not limited to SiO₂ and may be formed by using a substance having a transmissivity of not less than 96% to light to which it is exposed such as CaF₂ or MgF₂. The method of preparing an exposure mask described for the above example may be used with beams of other than KrF exposure wavelength such as g beams or i beams.

Example 5

In this example, an exposure mask for use with i beams was prepared.

Figure 9A:
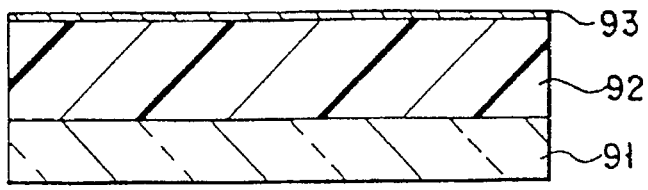
FIGS. 9A through 9I are sectional views of an exposure mask according to the invention and used in Example 1 as described hereinafter, showing so may different steps for preparing it.
Figure 9B:
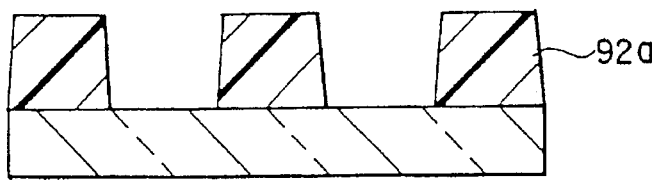
Figure 9C:
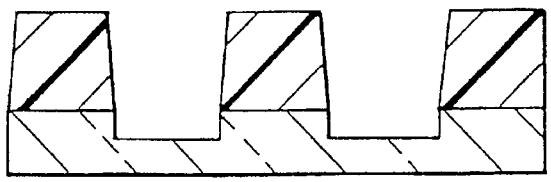
Figure 9D:

Firstly, as shown in FIG. 9A, a resist 92 designed for use with electron beams was applied to the surface of an SiO₂ substrate 91 designed for alignment purposes to a thickness of 92 µm and subsequently a conductive film 93 was formed by applying conductive material to a thickness of 0.2 µm. Thereafter, the film was exposed to electron beams at a rate of 6 µC/cm² and resist patterns 92a were produced by photographically developing the exposed film as shown in FIG. 9B. Then, as illustrated in FIG. 9C, the exposed areas of the substrate was anisotropically etched by using the resist patterns as a mask and a mixture gas of CF₄ and O₂. The substrate was etched to a depth of 388.2 nm and the etched areas showed a phase shifted by 180° relative to that of the unetched areas. The allowance for a phase shift of 180° is ±10° and it was found that the obtained phase shift satisfied this requirement. The resist patterns 92a were then removed by immersing the mask in an aqueous solution containing a mixture of sulfuric acid and hydrogen peroxide to produce transparent phase shift patterns as illustrated in FIG. 9D.

Figure 9E:

Thereafter, as shown in FIG. 9E, a translucent phase shift film 94 was formed on the surface of the transparent phase shift pattern carrying substrate to a thickness of 65 nm in a thin nitrogen atmosphere by sputtering, using silicon as target. The film was made of SiNβ.

Figure 9F:
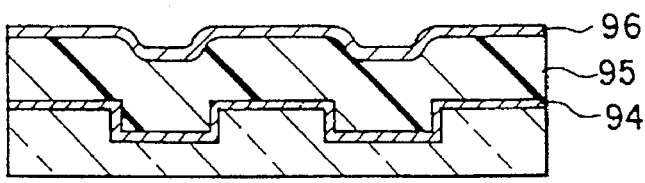
Figure 9G:
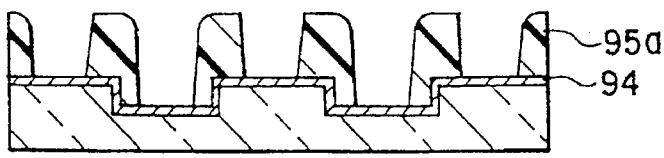
Figure 9H:
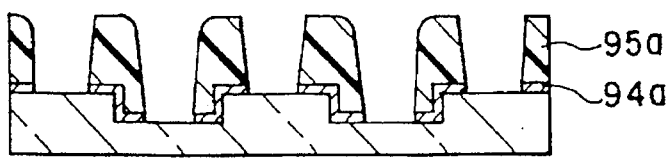
Figure 9I:

Then, a resist 95 designed for use with electron beams was applied to the obtained film to a thickness of 1.0 μm and thereafter a conductive film 96 was formed by application of a conductive material to a thickness of 0.2 μm as shown in FIG. 9F. Subsequently, the film was exposed to light at a rate of 6 μC/cm² and resist patterns 95a were produced by photographically developing the exposed film as shown in FIG. 9G. Following to this, exposed areas of the translucent phase shift film 94 were removed using the resist patterns 95a as a mask (FIG. 9H). Then, as shown in FIG. 9I, a translucent phase shift film 94a was obtained by peeling off the resist.

When, for the purpose of comparison, PfR-IX500 resist (tradename, available from Japan Synthetic Rubber Co., Ltd.) was used to form a film to a thickness of 1.2 μm, which was then exposed to light, for a conventional Levenson-type phase shift mask comprising opaque patterns to a thickness of 0.35 μm and phase shifter films for a phase shift between 0° and 180°, the mask showed a depth of focus of 1.0 μm when any two adjacent patterns had phases inverted relative to each other but did not provided a required dimensional accuracy through it showed a satisfactory resolution so long as no phase shift was involved.

Contrary to this, when the projection exposure mask of this examples was exposed to light, it showed a depth of focus of 1.8 μm at adjacent areas having phases inverted relative to each other and 0.6 μm at adjacent areas having an identical phase to prove a remarkable improvement for the overall depth of focus.

While SiNβ was used for a translucent phase shift film in the above example, a substance selected from silicon, germanium, gallium arsenide, titanium, aluminum, chromium, thin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to $SiO_2$ and may be formed by using a substance having a transmissivity of not less than 95% to light to which is exposed such as $CaF_2$ or $MgF_2$. The method of preparing an exposure mask described for the above example may be used with beams of other than i line exposure wavelength such as g line, h line of a mercury lamp or KrF beams.

Example 6

An exposure mask was prepared by the method described for Example 5 above so that patterns may be produced at the edges of its transparent phase shift patterns.

When, for the purpose of comparison, PFR-IX500 resist (tradename, available from Japan synthetic Rubber Co., Ltd.) was used to form a film to a thickness of 1.0 μm, which was then exposed to light, for a conventional mask comprising opaque patterns and phase shifter films for a phase shift between 0° and 180°, 0.25 μm pattern formed by using the edge sections of the transparent phase shift patterns showed a depth of focus of 1.25 μm. 0.4 μm patterns realized by using the opaque areas showed a depth of focus of 0.2 μm.

Contrary to this, when the projection exposure mask of this examples was exposed to light, 0.4 μm patterns formed by using the translucent phase shift patterns showed a remarkably increased depth of 1.0 μm, although 0.25 μm patterns produced by using the edge sections showed a depth of focus of 1.0 μm comparable to the corresponding patterns of a conventional mask.

The method of preparing an exposure mask described for the above example may be used with beams of other than i line exposure wavelength such as g line, h line of a mercury lamp or KrF beams.

Example 7

In the example, an exposure mask for use with KrF laser was prepared.

Figure 10A:
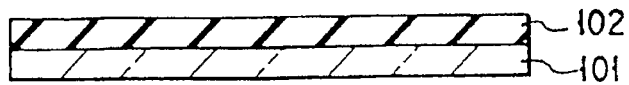
FIGS. 10A through 10J are sectional views of an exposure mask according to the invention and used in Example 7 as described hereinafter, showing different steps for preparing it.
Figure 10B:
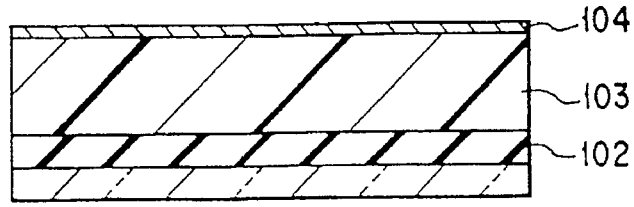
Figure 10C:
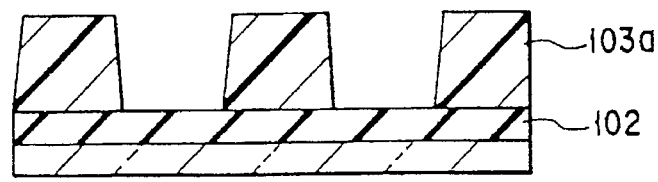
Figure 10D:
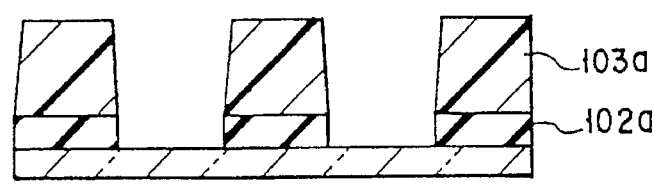
Figure 10E:
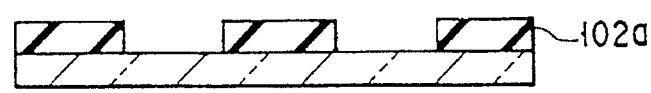

Firstly, as shown in FIG. 10A, an $Al_2O_3$ film 102 was formed to a thickness of 410 nm on an $SiO_2$ substrate 101 designed for alignment purposes. Then, a resist 103 designed for use with electron beams was applied thereto to form a film having a thickness of 1.0 μm and, as shown in FIG. 10B, a conductive film 104 was formed by applying a conductive material to a thickness of 0.2 μm. Thereafter, the film was exposed to electron beams at a rate of 6 μC/cm² and resist patterns 103a were produced by photographically developing the exposed film as shown in FIG. 10C. Then, as illustrated in FIG. 10D, the exposed areas of the substrate was anisotropically etched by using the resist patterns as a mask and $Cl_2$ gas. Thereafter, the resist patterns 103a were removed by exposing them to $O_2$ plasma to produce transparent phase shift patterns 102a having a phase shifted by 180° relative to that of the unetched areas as shown in FIG. 10E.

Figure 10F:
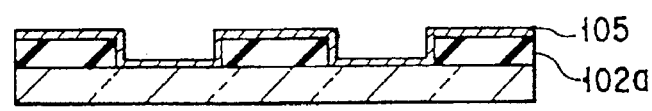

Thereafter, a translucent phase shift film 105 was formed on the surface of the substrate that carried the transparent phase shift patterns. More specifically, a transparent SiNα film 105 was formed to a thickness of 85 nm in a thin nitrogen atmosphere by sputtering, using silicon as target as shown in FIG. 10F.

Figure 10G:
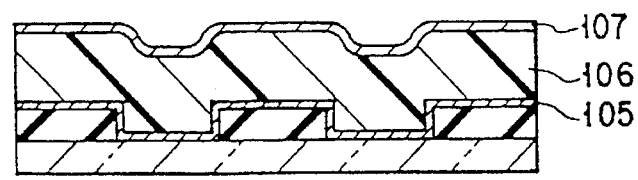
Figure 10H:
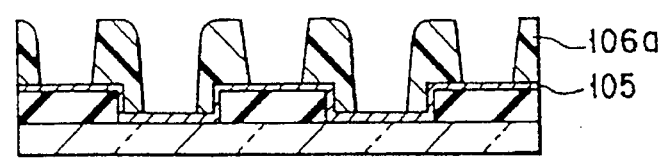
Figure 10I:
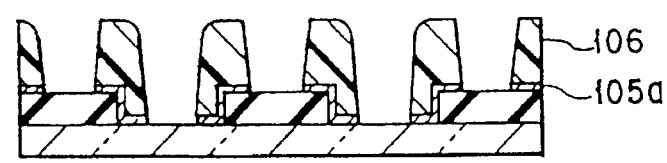
Figure 10J:

Then, a resist 106 designed for use with electron beams was applied to the obtained film to a thickness of 1.0 μm and thereafter a conductive film 107 was formed by application of conductive material to a thickness of 0.2 μm as shown in FIG. 10G. Subsequently, the film was exposed to electron beams at a rate of 6 μC/cm² and resist patterns 106a were produced by photographically developing the exposed film as shown in FIG. 10H. Following to this, exposed areas of the translucent phase shift film 105 were removed by anisotropic etching, using $CF_4$ gas and the resist patterns 106a as a mask as shown in FIG. 10I. Then, as shown in FIG. 10J, a translucent phase shift film 105a was obtained by peeling off the resist.

When, for the purpose of comparison, a resist available from Shipley Corporation under the tradename of SNR was used to form a film to a thickness of 1.0 μm, which was then exposed to light, for a conventional Levenson-type phase shift mask comprising opaque patterns to a thickness of 0.3 μm and phase shifter films for a phase shift between 0° and 180°, the mask showed a depth of focus of 1.5 μm when any two adjacent patterns had phases inverted relative to each other but did not provided a required dimensional accuracy through it showed a satisfactory resolution so long as no phase shift was involved.

Contrary to this, when the projection exposure mask of this examples was exposed to light, it showed a depth of focus of 1.8 μm at adjacent areas having phases inverted relative to each other and 0.3 μm at adjacent areas having an identical phase to prove a remarkable improvement for the overall depth of focus.

While SiNα was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them. The amplitude transmissivity of the translucent phase shift film may be appropriately adjusted to a value between 10 and 30%.

The material of the transparent phase shift film is not limited to $Al_2O_3$ and may be formed by using a substance having a transmissivity of not less than 95% to light to which it is exposed such as $CaF_2$ or $MgF_2$. The method of preparing an exposure mask described for the above example may be used with beams of other than KrF beam exposure wavelength such as g line, i line or h line of a mercury lamp.

Example 8

An exposure mask was prepared by the method described for Example 7 above so that patterns may be produced at the edges of its transparent phase shift patterns.

When, for the purpose of comparison, a resist available from Shipley Corporation under the tradename of SNR was used to form a film to a thickness of 1.0 μm, which was then exposed to light, for a conventional mask comprising opaque patterns to thickness of 0.3 μm and phase shifter films for a phase shift between 0° and 180° C., 0.25 μm patterns formed by using the edge sections of the transparent phase shift patterns showed a depth of focus of 1.2 μm. 0.4 μm patterns realized by using the opaque areas showed a depth of focus of 0.2 μm.

Contrary to this, when the projection exposure mask of this example was exposed to light, 0.4 μm patterns formed by using the translucent phase shift patterns showed a remarkably increased depth of 1.5 μm, although 0.25 μm patterns produced by using the edge section showed a depth of focus of 1.2 μm comparable to the corresponding patterns of a conventional mask.

The method of preparing an exposure mask described for the above example may be used with beams of other than KrF beam exposure wavelength such as g line, i line or h line of a mercury lamp.

Example 9

In this example, an exposure mask for use with i line of a mercury lamp was prepared.

Figure 11A:
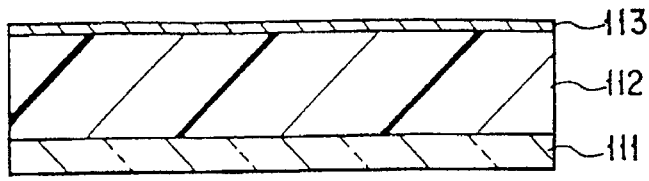
FIGS. 11A through 11I are sectional views of an exposure mask according to the invention and used in Example 9 as described hereinafter, showing different steps for preparing it.
Figure 11B:
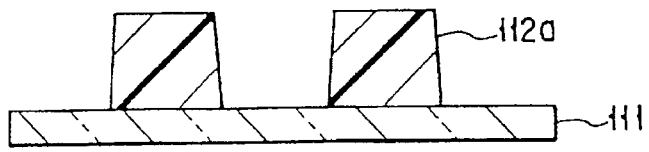
Figure 11C:
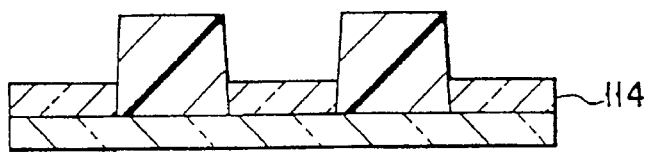

Firstly, as shown in FIG. 11A, a resist 112 designed for use with electron beams was applied to the surface of an $SiO_2$ substrate 111 for alignment to form a film having a thickness of 0.1 μm and then a conductive film 113 was formed by applying a conductive material to a thickness of 0.2 μm. Thereafter, the film was exposed to electron beams at a rate of 6 μC/cm² and resist patterns 112a were produced by photographically developing the exposed film as shown in FIG. 11B. Then, as illustrated in FIG. 11C, the exposed areas of the substrate was subjected to a selective growth of $SiO_2$. The formed film showed a thickness of 410 nm and a phase shifted by 180° relative to the areas that had not been subjected to a selective growth. The allowance for a phase shift of 180° is ±10° and it was found that the obtained phase shift satisfied this requirement.

Figure 11D:
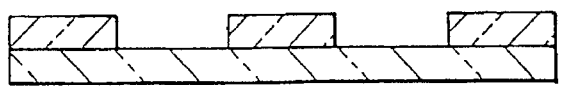

The resist patterns 112a were then removed by immersing the mask in an aqueous solution containing a mixture of sulfuric acid and hydrogen peroxide to produce transparent phase shift patterns of $SiO_2$ as illustrated in FIG. 11D.

Figure 11E:

Thereafter, a translucent phase shift film 114 was formed on the surface of the transparent phase shift pattern carrying substrate in a thin nitrogen atmosphere by sputtering, using silicon as target. The film 114 was made of SiNβ and has a thickness of 85 nm as illustrated in FIG. 11E.

Figure 11F:
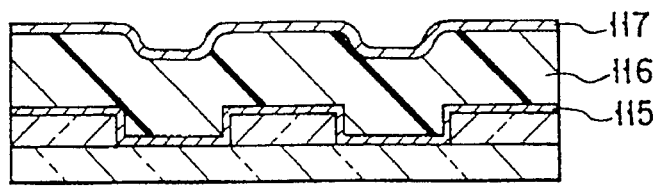
Figure 11G:
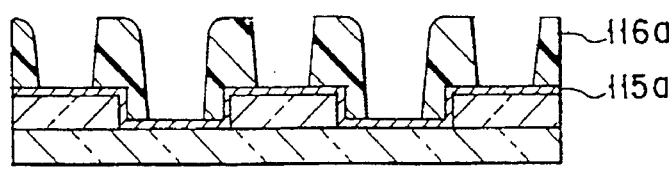
Figure 11H:
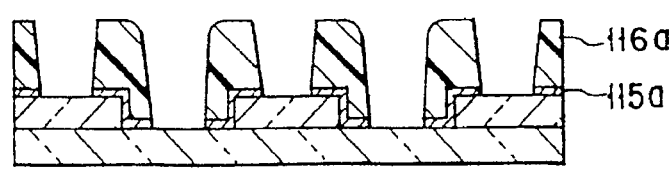
Figure 11I:
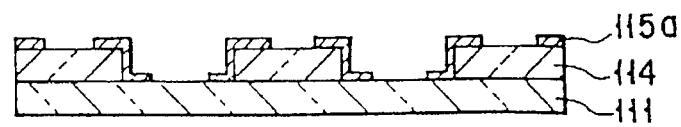

Then, a resist 116 designed for use with electron beams was applied to the obtained film to a thickness of 1.0 μm and thereafter a conductive film 117 was formed by application of a conductive material to a thickness of 0.2 μm as shown in FIG. 11F. Subsequently, the film was exposed to light at a rate of 6 μC/cm² and resist patterns 116a were produced by photographically developing the exposed film as shown in FIG. 11G. Following to this, exposed areas of the translucent phase shift film 114 were removed by using the resist patterns 116a as a mask as shown in FIG. 11H. Then, as shown in FIG. 11I, a translucent phase shift film 115a was obtained by peeling off the resist.

When, for the purpose of comparison, PFR-IX500 resist (tradename, available from Japan Synthetic Rubber Co., Ltd.) was used to form a film to thickness of 1.2 μm, which was then exposed to light, for a conventional Levenson-type phase shift mask comprising opaque patterns to a thickness of 0.35 μm and phase shifter films for a phase shift between 0° and 180°, the mask showed a depth of focus of 1.0 μm when any two adjacent patterns had phase inverted relative to each other but did not provide a required dimensional accuracy though it showed a satisfactory resolution so long as no phase shift was involved.

Contrary to this, when the projection exposure mask of this example was exposed to light, it showed depth of focus of 1.8 μm at adjacent areas having phases inverted relative to each other and 0.6 μm at adjacent areas having an identical phase to prove a remarkable improvement for the overall depth of focus.

While SiNβ was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film j not limited to $SiO_2$ and may be formed by using another appropriate material such as $CaF_2$, $MgF_2$ or $Al_2O_3$. The method of preparing an exposure mask described for the above example may be used with beams of other than i beams exposure wavelength such as g beams, h beams or KrF beams.

Example 10

An exposure mask was prepared by the method described for Example 9 above so that patterns may be produced at the edges of its transparent phase shift patterns.

When, for the purpose of comparison, PER-IX500 resist (tradename, available from Japan Synthetic Rubber Co., Ltd.) was used to form a film to a thickness of 1.2 µm, which was then exposed to light, for a conventional mask comprising opaque patterns to a thickness of 0.35 µm and phase shifter films for a phase shift between 0° and 180°, 0.25 µm patterns formed by using the edge sections of the transparent phase shift patterns showed a depth of focus of 1.0 µm. 0.4 µm patterns realized by using the opaque areas showed a depth of focus of 0.2 µm.

Contrary to this, when the projection exposure mask of this example was exposed to light, 0.4 µm patterns formed by using the translucent phase shift patterns showed a remarkably increased depth of 1.0 µm, although 0.25 µm patterns produced by using the edge sections showed a depth of focus of 1.0 µm comparable to the corresponding patterns of a conventional mask.

The method of preparing an exposure mask described for the above example may be used with beams of other than i beam exposure wavelength such as g beams, h beams or KrF beams.

Now, Examples 11 through 15 will be described below. There examples show an attempt to improve the dimensional accuracy of the resist patterns of Examples 5 through 10. When a (positive type) resist layer having one or more than one steps is exposed to light, the formed translucent phase shift patterns can show a high resolution exceeding the expected level because the lower portion of the resist can be left in an insufficiently exposed condition. In the following examples, this problems was resolved by planarizing the surface of transparent substrate.

Example 11

In this example, there was prepared a phase shift mask intended for use with g beams of a quick silver lamp as light source and designed to produce a negative interference effect between adjacent orifices and between each orifice and a translucent area adjacent to it.

Figure 12A:
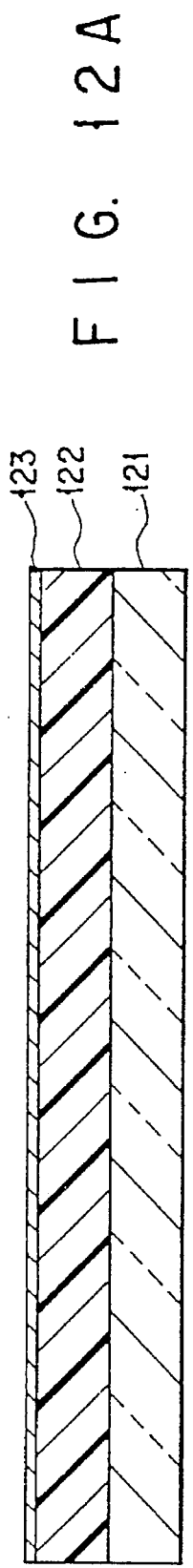
FIGS. 12A through 12K are sectional views of an exposure mask according to the invention and used in Example 9 as described hereinafter, showing different steps for preparing it.
Figure 12B:
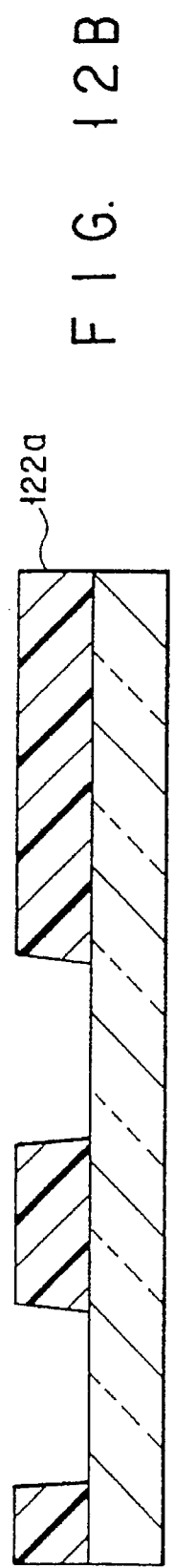
Figure 12C:
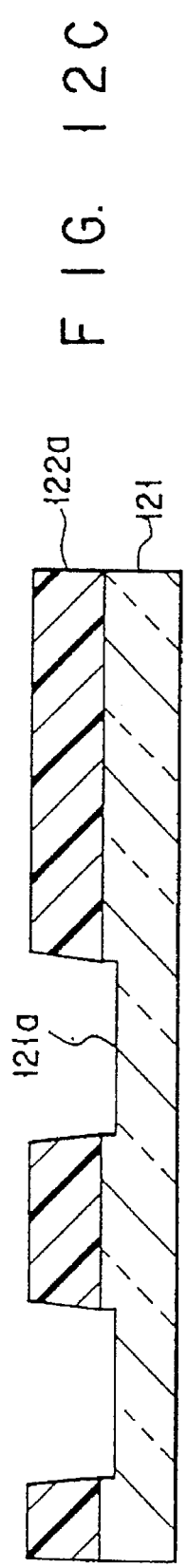
Figure 12D:

Firstly, as shown in FIG. 12A, a resist 122 designed for use with electron beams was applied to the surface of a quartz substrate 121 to form a film having a thickness of 500 nm and then a conductive film 123 was formed by applying a conductive material to a thickness of 200 nm. Thereafter, resist patterns 122a were formed by drawing the patterns on the film with electron beams and photographically developing the film as shown in FIG. 12b. Then, the substrate was anisotropically etched by $CF_4$ gas, using the resist patterns 122a as a mask and, as shown in FIG. 12C, phase shift areas 121a were formed by partially engraving the quartz substrate. Subsequently, the resist patterns 122a were then removed as shown in FIG. 12D.

Taking the refractive index of the substrate and that of a phase shift member to be formed as a film in a later step into consideration, it was necessary, at this stage, to adjust the depth of the engraved phase shift areas so that the phase of light passing though the phase shift member and that of light passing though the unengraved areas of the quartz substrate showed a shift of 180° relative to each other. As $Si_3N_4$ was used for the phase shift member in this example, the depth of the engraved phase shift areas was made to be equal to 366.4 nm, considering the refractive index of $Si_3N_4$ which is equal to 2.06.

Figure 12E:
Figure 12F:

Thereafter, as shown in FIG. 12E, a transparent phase shift layer 124 of $Si_3N_4$ was formed on at least the engraved areas of the quartz substrate to a thickness of 400 nm. Note that this film thickness may be varied if it is greater than the depth of the engraved transparent phase shift areas which was equal to 366.4 nm in this example. After the formation of the film, the entire surface of the substrate was polished and planarized as shown in FIG. 12F to produce phase shift patterns in the respective transparent phase shift areas.

Figure 12G:
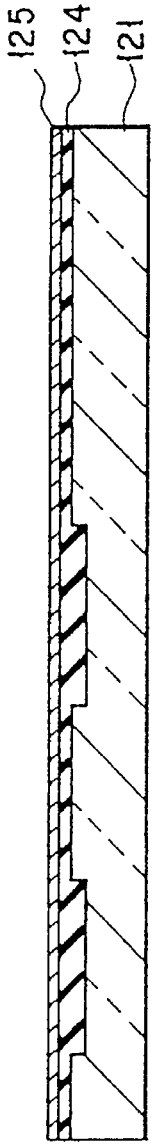

Then, as shown in FIG. 12G, a translucent phase shift film which was an amorphous silicon film 125 was formed on the surface of the planarized substrate to a thickness of 6.1 nm. Subsequently, the amorphous silicon film was so adjusted that it showed a phase differentiated by 180° from the phase of the areas carrying no amorphous silicon film and an amplitude transmissivity of 15%.

Figure 12H:
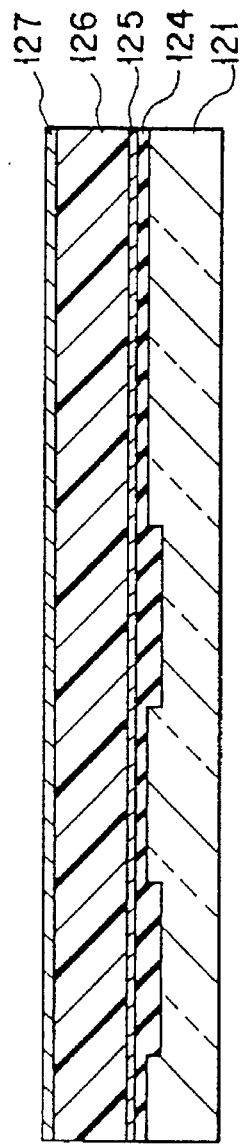
Figure 12I:
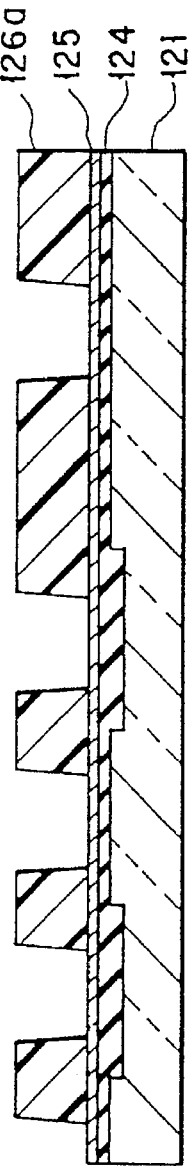

Then, a resist 126 designed for use with electron beams was applied to the obtained film to a thickness of 500 nm and, thereafter, a conductive film 127 was formed by application of a conductive material to a thickness of 200 nm as shown in FIG. 12H. Subsequently, the film was exposed to electron beams for alignment with the phase shift patterns and resist patterns 126a were produced by photographically developing the exposed film as shown in FIG. 12I.

Figure 12J:
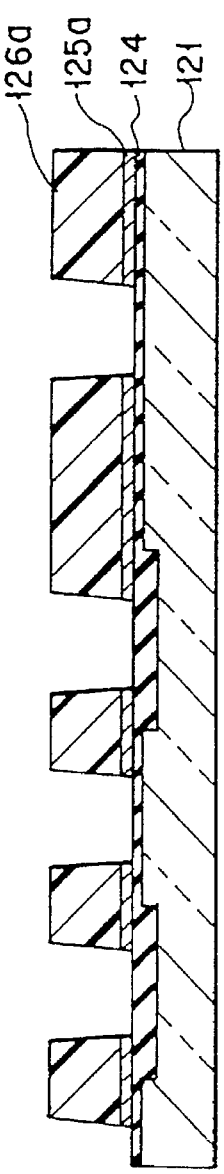
Figure 12K:
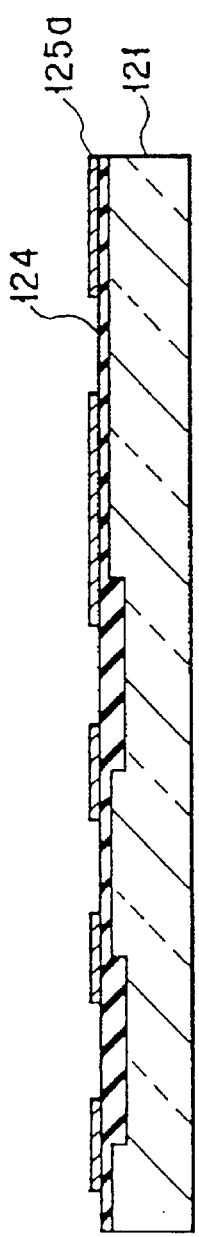

Following to this, exposed areas of the amorphous silicon film were removed to produce translucent phase shift patterns 125a by etching, using the resist patterns 126a as a mask as shown in FIG. 12J. Finally, as shown in FIG. 12K, an exposure mask with an excellent dimensional controllability was produced by peeling off the electron beams resist.

when the mask of this example was exposed to g beams, using a positive resist for g beams to a film thickness of 1.2 µm, it showed a depth of focus of 1.2 µm, at areas where repeated patterns of 0.45 µm were arranged in a zigzag manner corresponding to the transparent phase shift areas and a depth of focus of 0.5 µm at area where no phase shift areas were found on in the transparent substrate and isolated patterns of 0.45 µm were constituted solely by translucent phase shift patterns.

While quartz was used for a transparent substrate in the above example, a substrate principally composed of $Al_2O_3$, $MgF_2$, or $CaF_2$ may alternatively be used. Additionally, while $Si_3N_4$ was used for the phase shift member in this example, any material having a refractive index different from that of the substrate and an extinction coefficient substantially equal to that of the material constituting the substrate may alternatively be used. Again, while the substrate was planarized by polishing in this example, a planar film surface may be produced for the phase shift member by forming a phase shift member in the form of a film, planarizing it and then removing the multilayer film of the phase shift member and a resin material which maintaining the rate of etching the phase shift member equal to that of etching the resin material.

While amorphous silicon was used for the translucent phase shift film in this example, it may be replaced by germanium oxide, gallium oxide or arsenide. Finally, while the mask patterns were drawn in this example by using electron beams, they may alternatively be formed by using a photoresist and exposing it to light.

Example 12

Figure 13A:
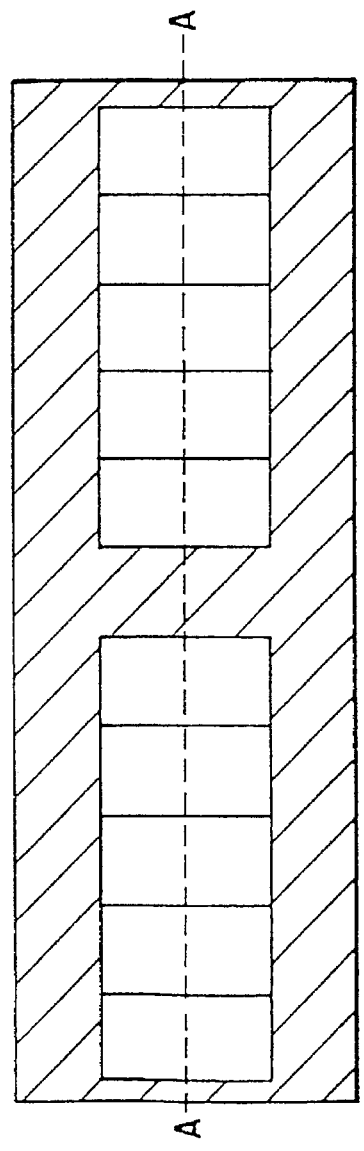
FIG. 13A is a plan view of an exposure mask according to the invention and used in Example 11 as described hereinafter.
Figure 13B:
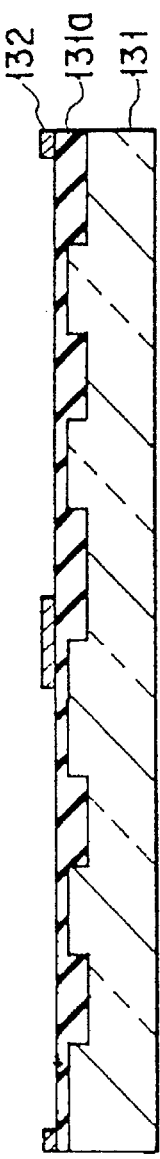
FIG. 13B is a sectional view of the exposure mask of FIG. 13A cut along line A—A.

An exposure mask was prepared by a method similar to the one used for Example 11 so that patterns may be produced at the edges of its transparent phase shift patterns. FIGS. 13A and 13B show schematic views of the mask. Reference numeral 131 in FIGS. 13A and 13B denotes e transparent mask substrate, while 131a and 132 respectively denote transparent phase shift areas and translucent phase shift areas.

When, PRF-IX500 resist (tradename, available from Japan Synthetic Rubber Co., Ltd.) was used to form a film to a thickness of 1.0 μm, which was then exposed to light, 0.25 μm patterns formed by using the edge sections of conventional transparent phase shift patterns showed a depth of focus of 1.0 μm. 0.4 μm patterns realized by using a translucent phase shift film showed also a depth of focus of 1.0 μm.

The method of preparing an exposure mask described for the above example may be used with beams of other than i line exposure wavelength such as g line, h line of a mercury lamp or KrF beams.

Example 13

In this example, there was prepared a phase shift mask intended for use with i line of a mercury lamp as light source and designed to produce a negative interference effect between adjacent orifices and between each orifice and a translucent area adjacent to it.

The steps of preparing the mask up to forming recessed patterns on the surface of a quartz substrate 141 are same as those as described above for example 11 by referring to FIGS. 12A through 12D, provided that SiNβ was used for a phase shift member and phase shift areas were formed to a depth of 301.7 nm taking the refractive index of SiNβ which is equal to 2.08 into consideration.

Figure 14A:
FIGS. 14A through 14H are sectional views of an exposure mask according to the invention and used in Example 1 as described hereinafter, showing different steps for preparing it.
Figure 14B:
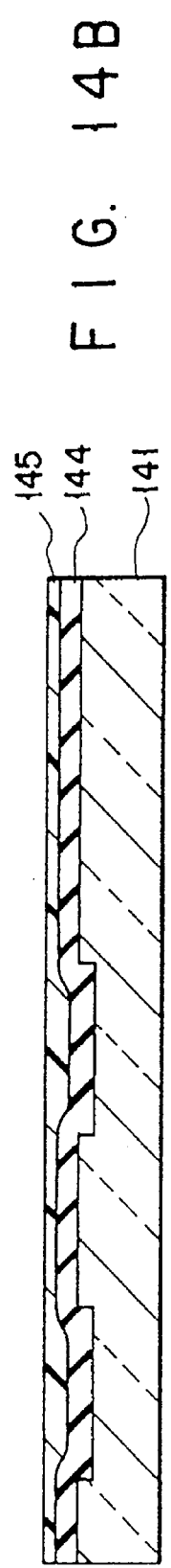
Figure 14C:
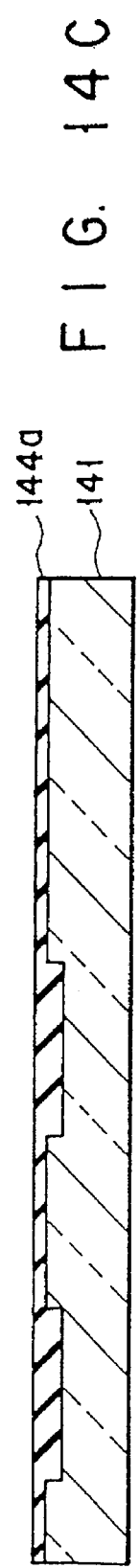

Thereafter, as shown in FIG. 14A, a transparent phase shift layer 144 of $Si_3N_4$ was formed on at least the engraved areas of the quartz substrate to a thickness of 350 nm. Note that this film thickness may be varied if it is greater than the depth of the engraved phase shift areas which was equal to 301.7 nm in this example. After the formation of the film, the entire surface of the substrate was planarized by applying a fluid resin material 145 as shown in FIG. 14B and then the phase shift member and the resin material were removed by etching to produce a planar film 144a for the phase shift member as shown in FIG. 14C, maintaining the rate of etching the phase shift member equal to that of etching the resin material.

Figure 14D:
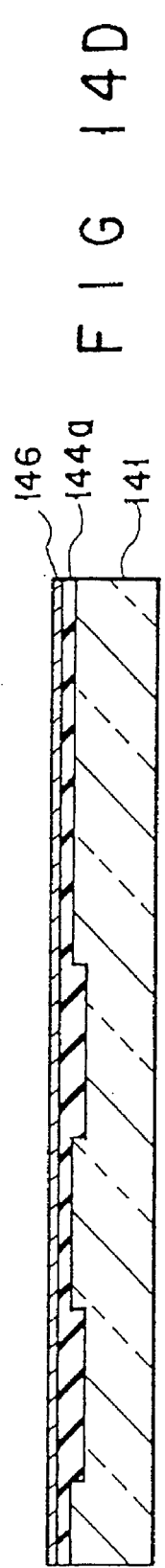

Then, as shown in FIG. 14D, an SiNβ film was formed to a thickness of 90 nm to produce a translucent phase shift film 146 on the planarized substrate. Subsequently, the SiNβ was so adjusted that it showed a phase differentiated by 180° from that phase of the areas carrying no SiNβ film and an amplitude transmissivity of 22%.

Figure 14E:
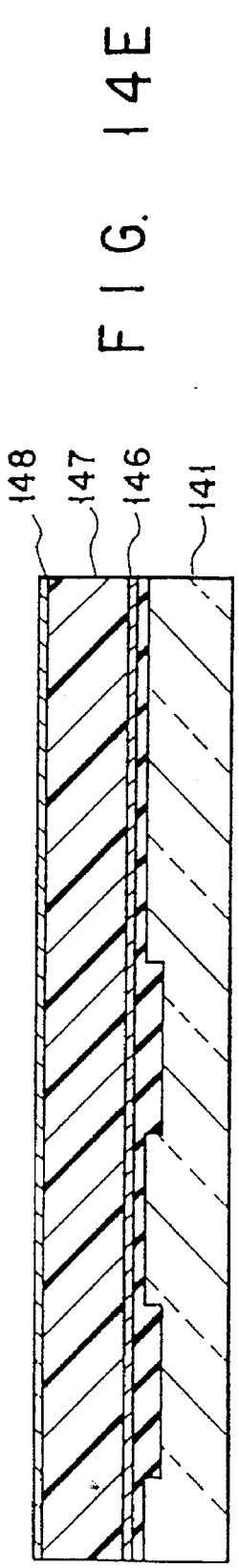
Figure 14F:
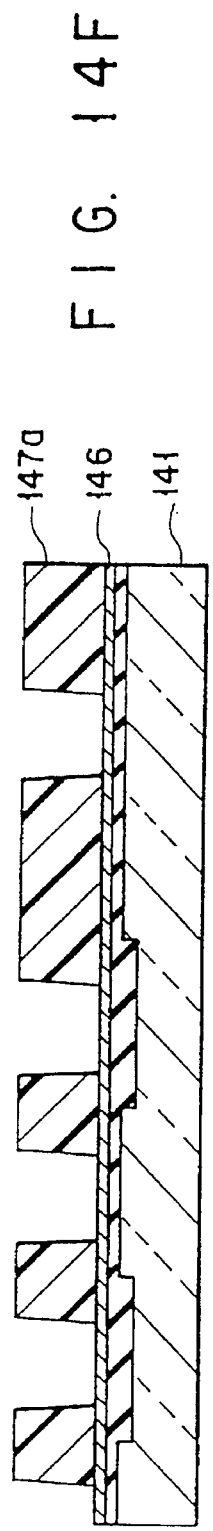

Then, as shown in FIG. 14E, a resist 147 designed for use with electron beams was applied to the substrate to form a film with a thickness of 500 nm and, thereafter, a conductive film 148 was formed by application of a conductive material to a thickness of 200 nm. Subsequently, the film was exposed to electron beams for alignment with the phase shift patterns and resist patterns 147a were produced by photographically developing the exposed film as shown in FIG. 14F.

Figure 14G:
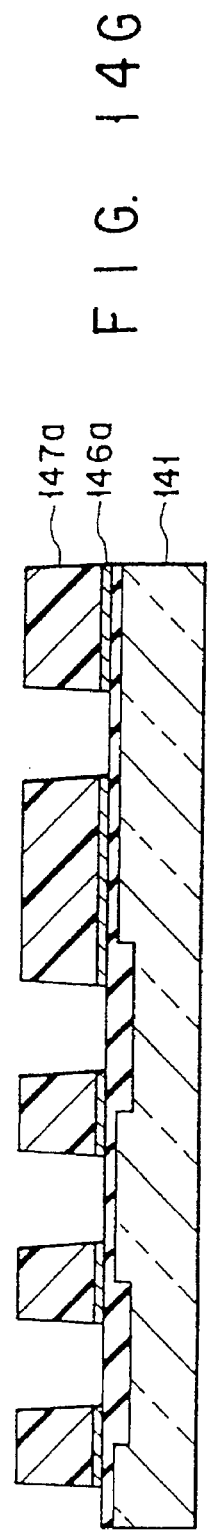
Figure 14H:
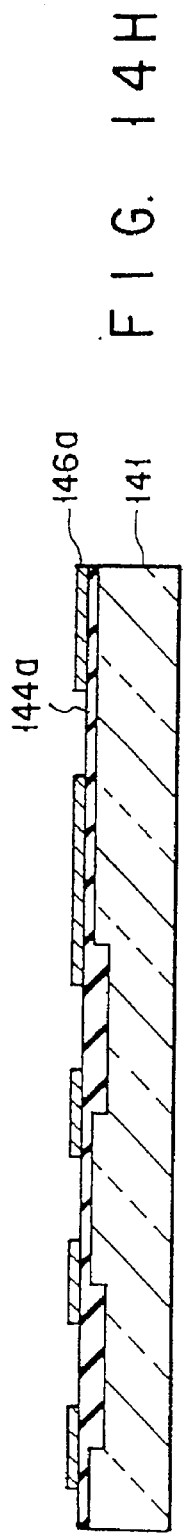

Following to this, exposed areas of the SiNβ film were removed to produce translucent phase shift patterns 146a by etching, using the resist patterns 147a as a mask as shown in FIG. 14G. Finally, as shown in FIG. 14H, an exposure mask with an excellent dimensional controllability was produced by peeling off the resist patterns 147a.

When the mask of this example was exposed to i beams, using PFX-IX500 resist (tradename, available from Japan Synthetic Rubber Co., Ltd.) to a film thickness of 1.2 μm, it showed a depth of focus of 1.3 μm at areas where repeated patterns of 0.35 μm were arranged in a zigzag manner corresponding to the transparent phase shift areas and a depth of focus of 0.6 μm at areas where no phase shift areas where found on in the transparent substrate and isolated patterns of 0.35 μm were constituted solely by translucent phase shift patterns.

As in the case of Example 11, the transparent substrate and the phase shift member as well as the method of planarizing them may be subject to various modifications and alterations. Additionally, while SiNβ was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances, having a strictly controlled composition could be used.

Example 14

In this example, there was prepared a phase shift mask intended for use with KrF excimer laser as light source and designed to produce a negative interference effect between adjacent orifices and between each orifice and a translucent area adjacent to it.

Firstly, a resist designed for use with electron beams was applied to the surface of a quartz substrate to form a film having a thickness of 500 nm and then a conductive film was formed by applying a conductive material to a thickness of 200 nm. Thereafter, resist patterns were formed by drawing the patterns on the film with electron beams and photographically developing the film. Then, the substrate was anisotropically etched by $CF_4$ gas, using the resist patterns as a mask and phase shift areas were formed by partially engraving the quartz substrate. Taking the refractive index of the substrate and that of a phase shift member to be formed as a film in a later step into consideration, it was necessary to adjust the depth of the engraved phase shift areas so that the phase of light passing through the phase shift member and that of light passing though the unengraved areas of the quarts substrate showed a shift of 180° relative to each other.

As $Al_2O_3$ was used for the phase shift member in this example, the depth of the engraved phase shift areas was made to be equal to 496 nm, considering the refractive index of $Al_2O_3$ which is equal to 1.74 for KrF excimer laser used as light source when the phase shift member has a thickness of 248 nm.

Thereafter, a transparent phase shift laser 124 of $Al_2O_3$ was formed on at least the engraved area of the quartz substrate to a thickness of 500 nm. Note that this film thickness may be varied if it is greater than the depth of the engraved transparent phase shift areas which was equal to 496 nm in this example. After the formation of the film, the entire surface of the substrate was polished and planarized to produce phase shift patterns in the respective transparent phase shift areas.

Then, a translucent phase shift film which was an SiNα film was formed on the surface of the planarized substrate to a thickness of 100 nm. Subsequently, the film was so adjusted that it showed a phase differentiated by 180° form that phase of the areas carrying no SiNα film and an amplitude transmissivity of 22%.

Then, a resist designed for use with electron beams was applied to the obtained film to a thickness of 500 nm and, thereafter, the film was exposed to electron beams for alignment with the phase shift patterns and then photographically developed to produce resist patterns. Following to this, exposed areas of the SiNα film were removed to produce translucent phase shift patterns by etching, using the resist patterns as a mask. Finally, an exposure mask with an excellent dimensional controllability was produced by peeling off the electron beam resist.

When the mask of this example was exposed to KrF beams, using SNR resist (tradename, available from Shipley Corporation) to a film thickness of 1.0 μm, it showed a depth of focus of 1.6 μm at areas where repeated patterns of 0.3 μm were arranged in a zigzag manner corresponding to the transparent phase shift areas and a depth of focus of 0.3 μm at areas where no phase shift areas were found on in the transparent substrate and isolated patterns of 0.3 μm were constituted solely by translucent phase shift patterns.

As in the case of Example 11, the transparent substrate and the phase shift member as well as the method of planarizing them may be subject to various modifications and alterations. Additionally, while SiNα was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances having strictly controlled composition could be used.

Example 15

In this example, there was prepared a phase shift mask intended for use with ArF excimer laser as light source and designed to produce a negative interference effect between adjacent orifices and between each orifice and a translucent area adjacent to it.

The steps of preparing the mask up to forming recessed patterns on the surface of a quartz substrate 151 are same as those as described above for Example 11 by referring to FIGS. 12A through 12D, provided that $N_2$ was used for a phase shift member and phase shift areas were formed to a depth of 138 nm taking the refractive index of $N_2$ which id equal to 1.0 into consideration.

Figure 15A:
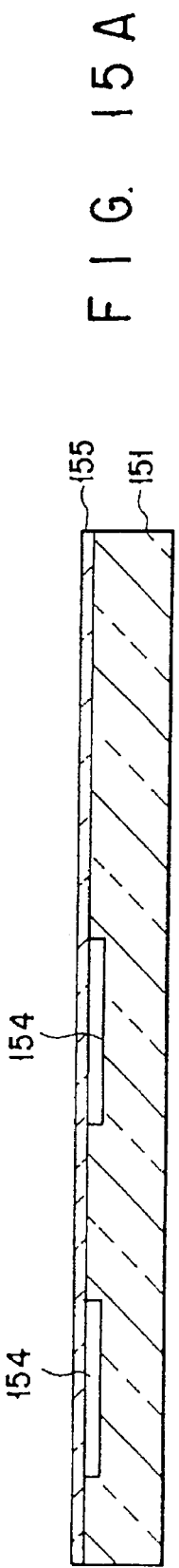
FIGS. 15A through 15F are sectional views of an exposure mask according to the invention and used in Example 7 as described hereinafter, showing different steps for preparing it.

Thereafter, as shown in FIG. 15A, a transparent plate 155 made of a material same as that of the transparent substrate was bonded onto the transparent substrate in an $N_2$ atmosphere. Reference numeral 154 denotes the areas sealed by the plate.

Figure 15B:
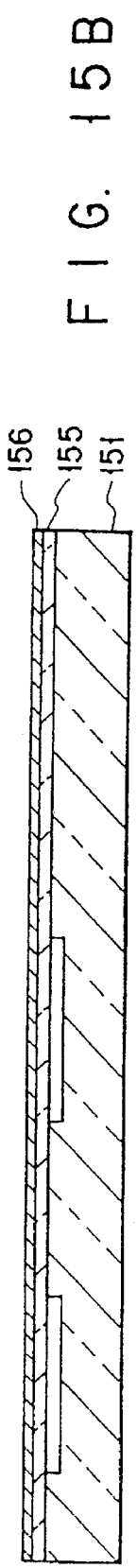

Then, as shown in FIG. 15B, an SiOγ (1.0<γ<1.9) film was formed to a thickness of 175 nm to produce a translucent phase shift film 156 on the planarized substrate. Subsequently, the SiNγ film was so adjusted that it showed a phase differentiated by 180° from that phase of the areas carrying on SiNγ film and an amplitude transmissivity of 21%.

Figure 15C:
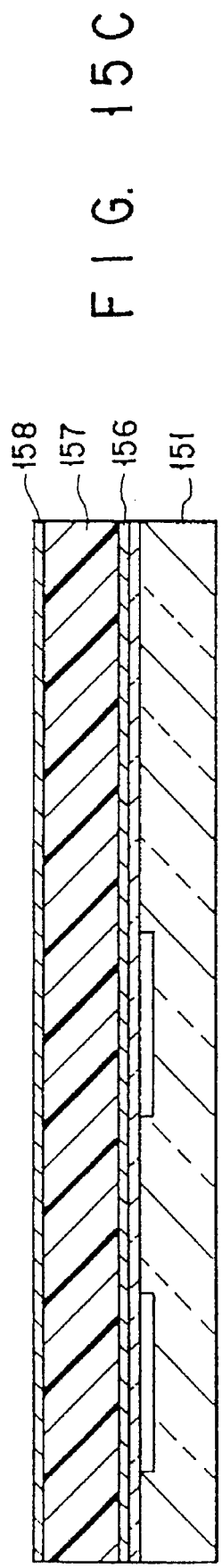
Figure 15D:
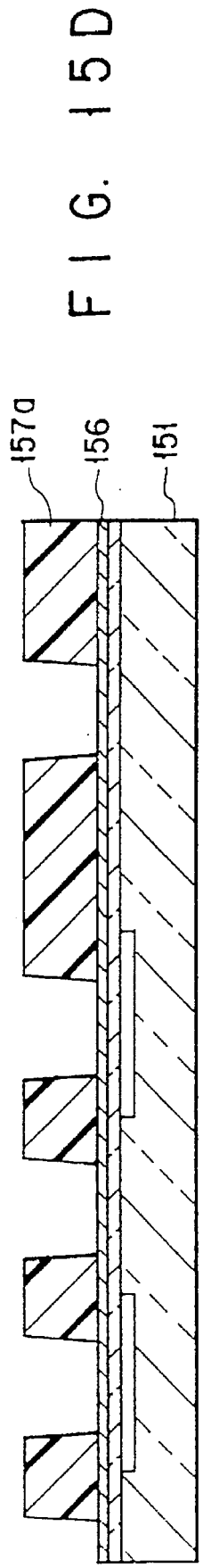

Then, as shown in FIG. 15C, a resist 157 designed for use with electron beams was applied to the substrate to form a film with a thickness of 500 nm and, thereafter, a conductive film 158 was formed by application of a conductive material to a thickness of 200 nm. Subsequently, the film was exposed to electron beams for alignment with the phase shift patterns and resist patterns 157a were produced by photographically developing the exposed film as shown in FIG. 15D.

Figure 15E:
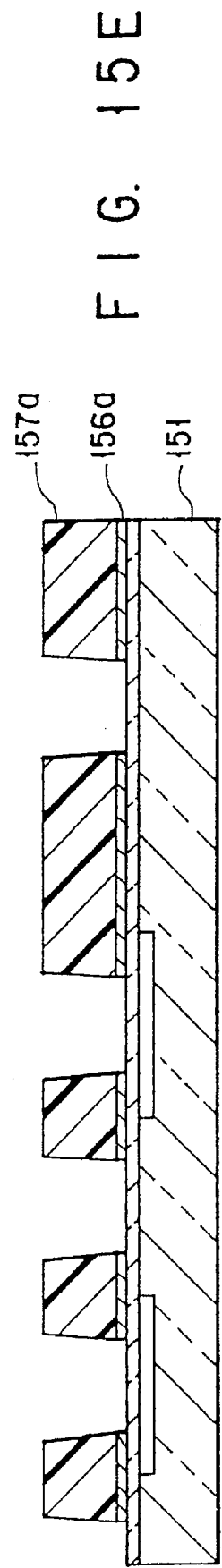
Figure 15F:
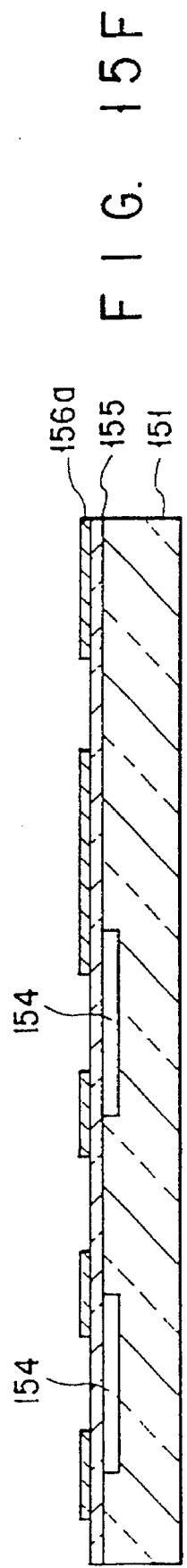

Following to this, exposed areas of the SiNγ film were removed to produce translucent phase shift patterns 156a by etching, using the resist patterns as a mask as shown in FIG. 15E. Finally, as shown in FIG. 15F, an exposure mask with an excellent dimensional controllability was produced by peeling off the electron beam resist.

When the mask of this example was exposed to ArF beams, using PMMA resist to a film thickness of 0.2 μm, it showed a depth of focus of 1.4 μm at areas where repeated patterns of 0.20 μm were arranged in a zigzag manner corresponding to the transparent phase shift areas and a depth of focus of 0.3 μm at areas where no phase shift areas were found on in the transparent substrate and isolated patterns of 0.2 μm were constituted solely by translucent phase shift patterns.

The relationship between a focal latitude and the ratio of the space width of each patterns to the pitch width of the same will be explained. In FIG. 3A, suppose that an exposed portion 34 of the substrate 31 is a first region; a region 35 adjacent to the first region, in which only a translucent phase shift pattern exists, is a second region; a region 37 adjacent to the second region, in which a transparent phase shift pattern is laminated on the translucent phase shift pattern, is a third region; and a region 36 adjacent to the third region, in which only the transparent phase shift pattern exists, is a fourth region.

As is shown in FIG. 16, the exposure mask comprises pattern groups each consisting of the first through fourth regions. Each adjacent pair of the pattern groups use the fourth (or first) region as a common region and are arranged symmetrical with respect to the fourth (or first) region. Further, in each of the pattern groups, the widths of the first and fourth regions are equal to each other, and those of the second and third regions are equal to teach other. This mask is employed in an exposure device with a wavelength of 248 nm, NA=0.5, and σ=0.3. Using the exposure device, a 0.18 μm pattern is formed on a wafer. FIG. 16 shows focal latitudes corresponding to values each obtained by dividing a pattern width corresponding to the width of the first region (space), by a pattern width corresponding to the sum of the widths of the first through third regions.

As is evident from FIG. 16, the focal latitude little changes if the value is lower than 0.25. In other words, there is no phase shift effect between openings formed in transparent patterns, in a pattern group in which the sum of the widths of the second and third regions is 3 or more where the width of the openings formed in the light-transmissive substrate and the transparent phase shift pattern is 1. Therefore, in a region where each adjacent pair or the pattern groups are arranged symmetrical with respect to the first or fourth regions as a common region, it is preferable that a value obtained by dividing the width of the first region by the sum of the widths of the first through third regions is 0.25 or more. The same can be said of cases where other pattern sizes and/or other exposure conditions (wavelength, NA, σ) than those of the above-described case are employed.

While an electron beam resist was used to draw patterns with electron beams for the formation of mask patterns in the above example, mask patterns may alternatively be formed by using a photoresist and beams of light for alignment. Additionally, while quartz was used for a transparent substrate in the above example, a substrate principally composed of $Al_2O_3$, $MgF_2$, or $CaF_2$ may alternatively be used. While $N_2$ was used for the phase shift member in this example, any material having a refractive index different from that of the substrate and an extinction coefficient substantially equal to that of the material constituting the substrate may alternatively be used.

Further, while a same material was used for both the transparent plate and the transparent substrate in the above example, they may be made of materials different from each other. The transparent plate may show a slight extent of light absorption. Still additionally, while an SiNγ was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances having a strictly controlled composition could be used.

Example 16

Figure 17:
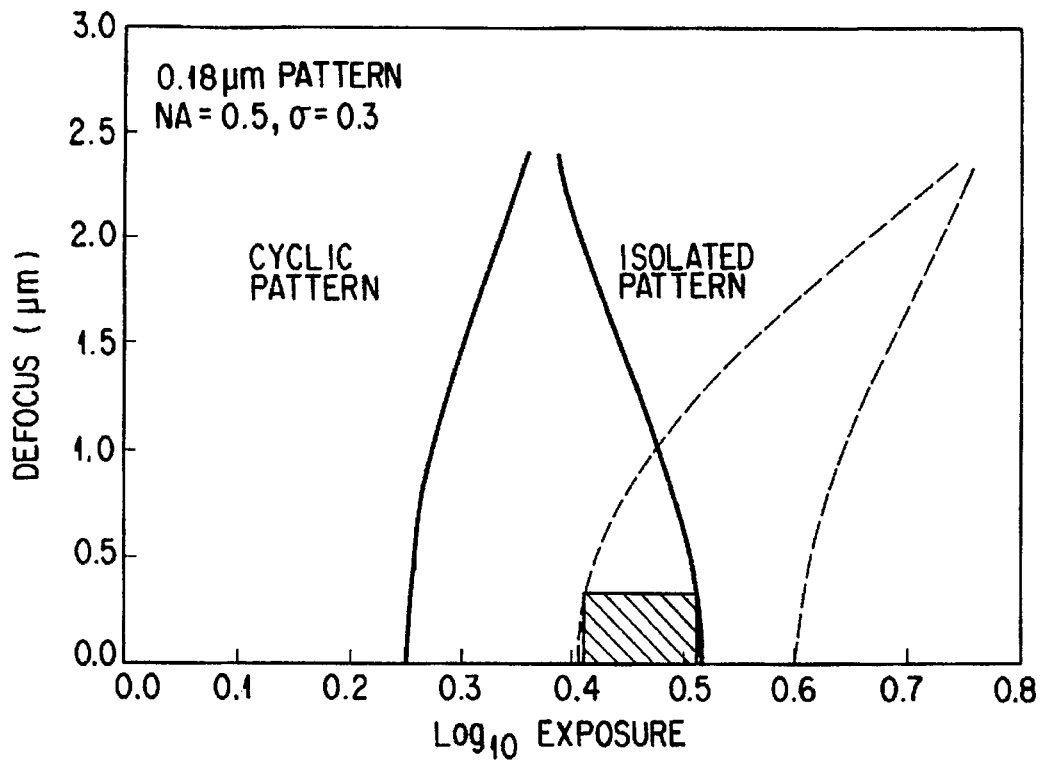
FIG. 17 is a graph for explaining a proper exposure light amount in order to obtain a periodic pattern and an isolated pattern by using a conventional exposure mask and a focal depth in this case.

In a system in which a Levenson effect and a half-tone effect are combined, a proper exposure light amount differs greatly between a periodic pattern and an isolated pattern and consequently a great focal depth cannot be obtained. For example, FIG. 17 shows exposure amounts, in relation to defocus amounts, which are necessary for resolving at ±10% of desired size a line & space pattern with L=0.18 μm and an isolated pattern (a pattern with a distance of 3L or more from an adjacent pattern L: corresponding to an isolated opening portion of an exposure mask). In FIG. 17, the region defined by solid lines is a periodic pattern and the region defined by broken lines is an isolated pattern, and ranges of necessary exposure light amounts are indicated. The proper exposure light amount differs greatly between the periodic pattern and isolated pattern. It is understood that a greater exposure light amount is needed for the isolated pattern. If both patterns are simultaneously resolved at ±10% of desired size and a 10% margin needs to be kept, a focal depth of only 0.33 μm is obtained (a region indicated by hatching lines).

According to a fifth aspect of the present invention, there is provided an exposure mask for an exposure system in which a Levenson method and a half-tone method are combined, wherein a difference in proper exposure light amount occurring in a translucent periodic pattern is reduced and a focal depth is increased both in a periodic pattern and an isolated pattern.

Specifically, in a first mode of the fifth aspect of the present invention, there is provided an exposure mask characterized in that the exposure mask is formed by providing a mask pattern on a light-transmissive substrate, the mask pattern includes as a structural element a translucent phase shift pattern having an optical path length differing by at least 180° for exposure light from an optical path length difference between the light-transmissive substrate and a transparent phase shift pattern, the mask pattern includes a region where the transparent phase shift pattern partially overlaps the translucent phase shift pattern, at least one opening portion on the light-transmissive substrate has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and a region of the translucent phase shift pattern having an optical path length differing by about 180° from the opening portion is provided on the outside of the overlap region.

In the first mode of the fifth aspect of the invention, it is preferable that at least one opening portion on the light-transmissive substrate is formed along an outer peripheral portion of a dense pattern group, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, a region of the translucent phase shift pattern having an optical path length differing by about 180° from the opening portion being provided on the outside of the overlap region.

In addition, in the first mode of the fifth aspect of the invention, it is preferable that at least one opening portion on the light-transmissive substrate has a distance from an adjacent opening portion which is three times or more the width of the opening portion, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, a region of the translucent phase shift pattern having an optical path length differing by about 180° from the opening portion being provided on the outside of the overlap region.

In a second mode of the fifth aspect of the invention, there is provided an exposure mask characterized in that the exposure mask is formed by providing a mask pattern on a light-transmissive substrate, the mask pattern includes as a structural element a translucent phase shift pattern having an optical path length differing by at least 180° for exposure light from an optical path length difference between the light-transmissive substrate and a transparent phase shift pattern, the mask pattern includes a region where the transparent phase shift pattern partially overlaps the translucent phase shift pattern, at least one opening portion on the light-transmissive substrate has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In the second mode of the fifth aspect, it is preferable that at least one opening portion on the light-transmissive substrate is formed along an outer peripheral portion of a dense pattern group, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In addition, in the second mode of the fifth aspect, it is preferable that at least one opening portion on the light-transmissive substrate has a distance from an adjacent opening portion which is three times or more the width of the opening portion, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In a third mode of the fifth aspect, there is provided an exposure mask characterized in that the exposure mask is formed by providing a mask pattern on a light-transmissive substrate, the mask pattern includes as a structural element a translucent phase shift pattern having an optical path length differing by at least 180° for exposure light from an optical path length difference between the light-transmissive substrate and a transparent phase shift pattern, the mask pattern includes at least a portion of the translucent phase shift pattern so as to include a boundary of the transparent phase shift pattern, at least one opening portion on the light-transmissive substrate has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and a region of the translucent phase shift pattern having an optical path length differing by about 180° from the opening portion is provided on the outside of the overlap region.

In the third mode of the fifth aspect, it is preferable that at least one opening portion on the light-transmissive substrate is formed along an outer peripheral portion of a dense pattern group, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, a region of the translucent phase shift pattern having an optical path length differing by about 180° from the opening portion being provided on the outside of the overlap region.

In addition, in the third mode of the fifth aspect of the invention, it is preferable that at least one opening portion on the light-transmissive substrate has a distance from an adjacent opening portion which is three times or more the width of the opening portion, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, a region of the translucent phase shift pattern having an optical path length differing by about 180° from the opening portion being provided on the outside of the overlap region.

In a fourth mode of the fifth aspect, there is provided an exposure mask characterized in that the exposure mask is formed by providing a mask pattern on a light-transmissive substrate, the mask pattern includes as a structural element a translucent phase shift pattern having an optical path length differing by at least 180° for exposure light from an optical path length difference between the light-transmissive substrate and a transparent phase shift pattern, the mask pattern includes at least a portion of the translucent phase shift pattern so as to include a boundary of the transparent phase shift pattern, at least one opening portion on the light-transmissive substrate has at least at an adjacent region an overlap region of the transparent phase shift pattern and the translucent phase shift pattern, each of the transparent phase shift pattern and translucent phase shift pattern having a phase difference of about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In the fourth mode of the fifth aspect, it is preferable that at least one opening portion on the light-transmissive substrate is formed along an outer peripheral portion of a dense pattern group, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In addition, in the fourth mode of the fifth aspect, it is preferable that at least one opening portion on the light-transmissive substrate has a distance from an adjacent opening portion which is three times or more the width of the opening portion, which opening has at least at an adjacent region an overlap region of the transparent phase shift pattern and the translucent phase shift pattern, each of the transparent phase shift pattern and translucent phase shift pattern having an optical path length differing by about 180° from the opening portion for exposure light, and at least one unit region comprising two regions of a region of the translucent phase shift pattern having an optical path length differing by about 180° from the opening portion and an overlap region of the transparent phase shift pattern and the translucent phase shift pattern, each of which has an optical path length differing by about 180° from the opening portion, is provided on the outside of the overlap region.

In the first to fourth modes of the fifth aspect of the invention, it is preferable that in the dense pattern group the opening portion has a distance from the adjacent opening portion which is three times or less the width of the adjacent opening portion.

In the first to fourth modes of the fifth aspect, it is preferable that the translucent shift pattern is formed of one of silicon, germanium, gallium arsenide, titanium, aluminum, chromium, tin, indium, nickel, cobalt, tantalum, hafnium and metal silicide, or one of oxides, nitrides, hydrides, carbides and halogenides thereof, or a mixture thereof.

Figure 21A:
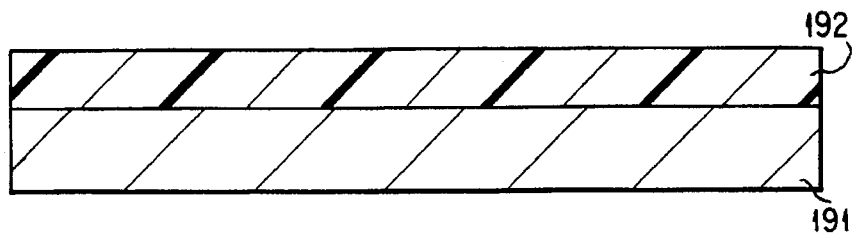
FIGS. 21A to 21I are cross-sectional views illustrating steps of manufacturing the exposure mask according to Example 16 of the present invention.
Figure 21B:
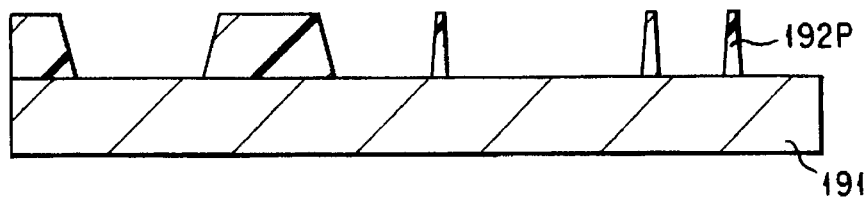
Figure 21C:
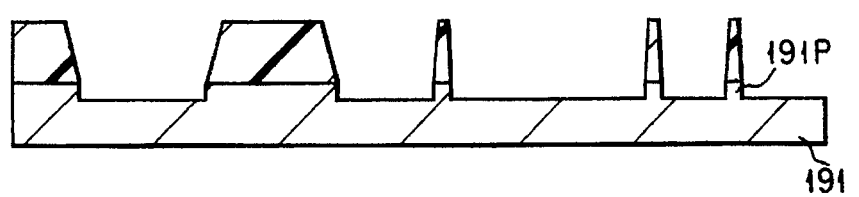
Figure 21D:
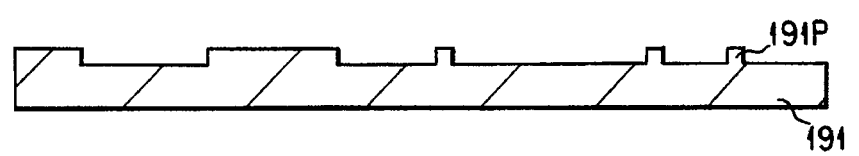
Figure 21E:
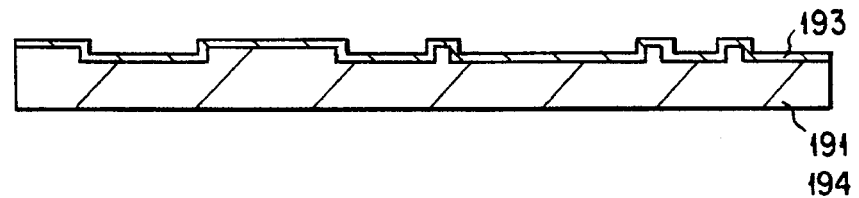
Figure 21F:
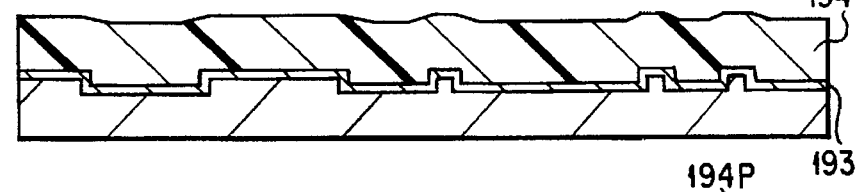
Figure 21G:
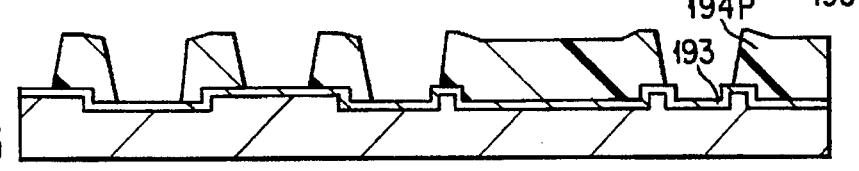
Figure 21H:
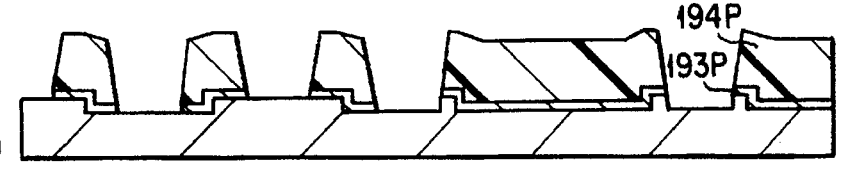
Figure 21I:
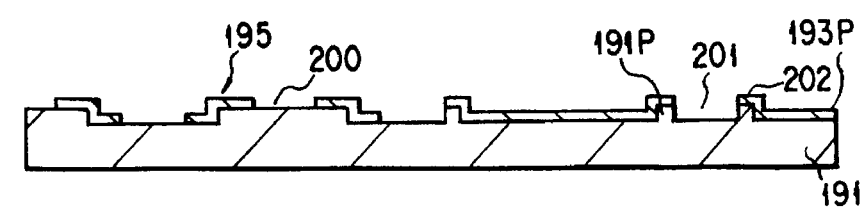

FIG. 21I shows a cross-sectional structure of an exposure mask according to the fifth aspect of the invention. Attention is now paid to one opening portion 200 of a periodic pattern group comprising lines & spaces (dense pattern portion of opening portion: translucent light shield portion=1:1). A translucent phase shift pattern 193P having an optical path length differing by about 180° from the opening is provided around the opening portion 200. An edge of a transparent phase shift pattern 191P is situated at a substantially middle portion 195 of an adjacent opening portion. With this arrangement, phase shift effects can be obtained between main opening portions as well as between a main opening portion and an adjacent translucent phase shift pattern. The transparent phase shift pattern 191P is formed of the same material as a transparent substrate 191 and is formed of a projection which is left after selectively etching the transparent substrate 191.

On the other hand, in an isolated mask pattern (isolated portion of opening portion: translucent light shield portion=

1:3), a region 202 formed by laminating the translucent phase shift pattern 193P and the transparent phase shift pattern 191P each having an optical path length differing by 180° from a main opening portion 201 is provided adjacent to the main opening portion 201. A translucent phase shift pattern alone, having an optical path length differing by 180° from the opening, is provided outside the region 202. Thereby, image intensity can be increased.

FIGS. 18A and 18B and FIGS. 19A and 19B show image intensities of line & space mask patterns (FIGS. 18A and 19A) of 0.18 μm and isolated mask patterns (FIGS. 18B and 19B) of 0.18 μm on the wafers according to the fifth aspect of the present invention and the conventional method. Reference numeral 161 (181) denotes a light-transmissive substrate, numeral 162 (182) a transparent phase shift film, numeral 163 (183) a translucent phase shift film, numeral 164 an opening portion, numeral 165 an overlap region, numeral 166 an outside region, numeral 170 (175) an image intensity representing a boundary level, e.g. at the time of development, and numeral 171 a peripheral portion of the isolated pattern.

Figure 19B:
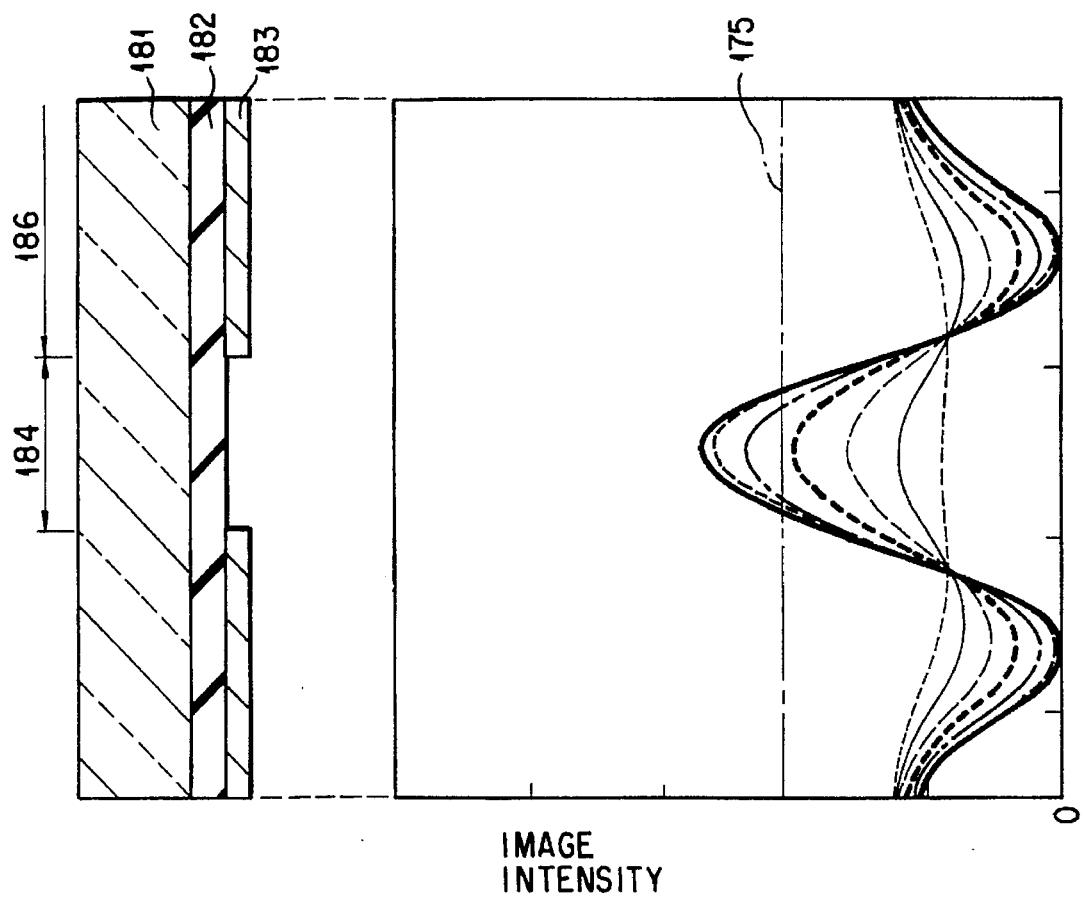
FIGS. 19A and 19B show cross-sections and image intensities of a periodic pattern and an isolated pattern in the case where a conventional exposure mask was used.
Figure 19A:
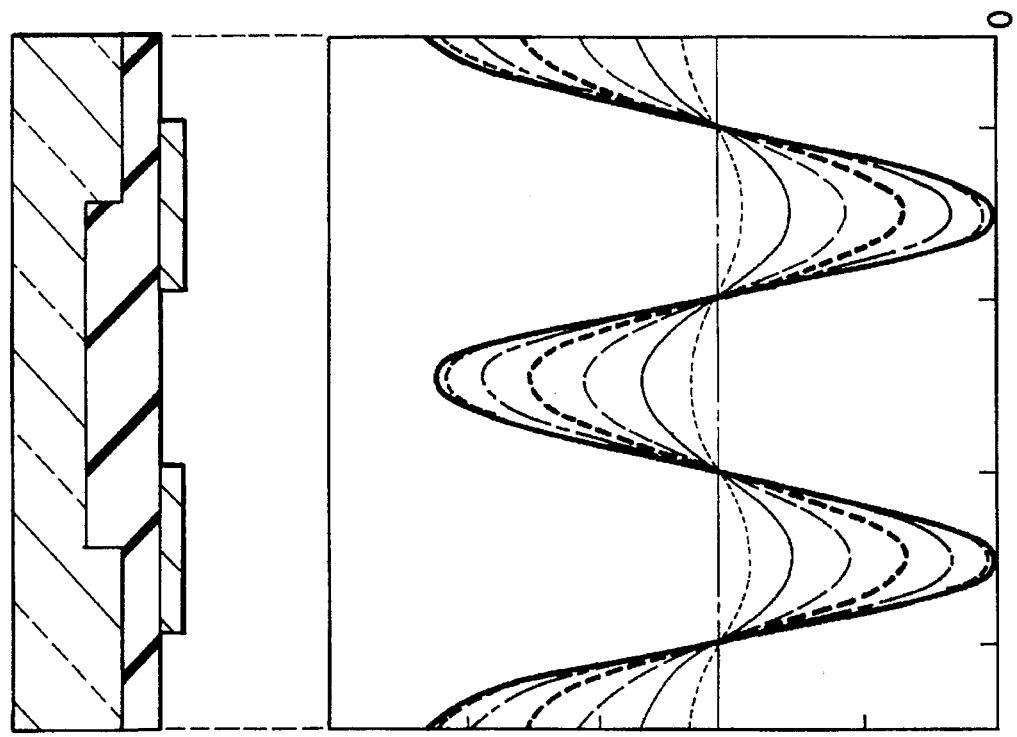

In the conventional exposure mask shown in FIGS. 19A and 19B, the pattern width adjacent to the mask space width is small in the isolated mask pattern at an image intensity 175 at which the line & space mask pattern is resolved with a ratio of 1:1. In this case, the dimensions of the finished line & space pattern differ from those of the finished isolated pattern in the resist pattern. On the other hand, in the exposure mask (FIG. 21I) according to the fifth aspect of the invention, as shown in FIGS. 18A and 18B, both patterns can be resolved with desired sizes at the same image intensity 170. It is preferable that the distance between the edge of the main opening and the boundary of the transparent phase shift pattern is about L/4 (0.045 μm on the wafer in FIGS. 18A and 18B) with respect to the dimension L of the main opening portion.

In the arrangement of the phase shifter shown in FIG. 18B, the light intensity is high at a peripheral portion 171 of the isolated pattern (the isolated portion with the ratio, the opening portion: the transparent light shield portion=about 1:3). To solve this problem, the region adjacent to the main opening portion is formed to have an overlap region where the translucent phase shift pattern overlaps the transparent phase shift pattern, on the outside of which overlap region the translucent phase shift pattern region and transparent phase shift pattern, each having an optical path length differing by about 180° from at least one pair of opening portions, overlap each other, and a region covered with the translucent phase shift pattern having an optical path length differing by about 180° from the opening portion. This pair of regions should preferably have a size of about L/2. However, the size is not limited to this value, if the light intensity at the periphery of the main opening portion can be restricted to such a level that no resist remains at the time of exposure (in the case where a negative resist is used).

Figure 20:
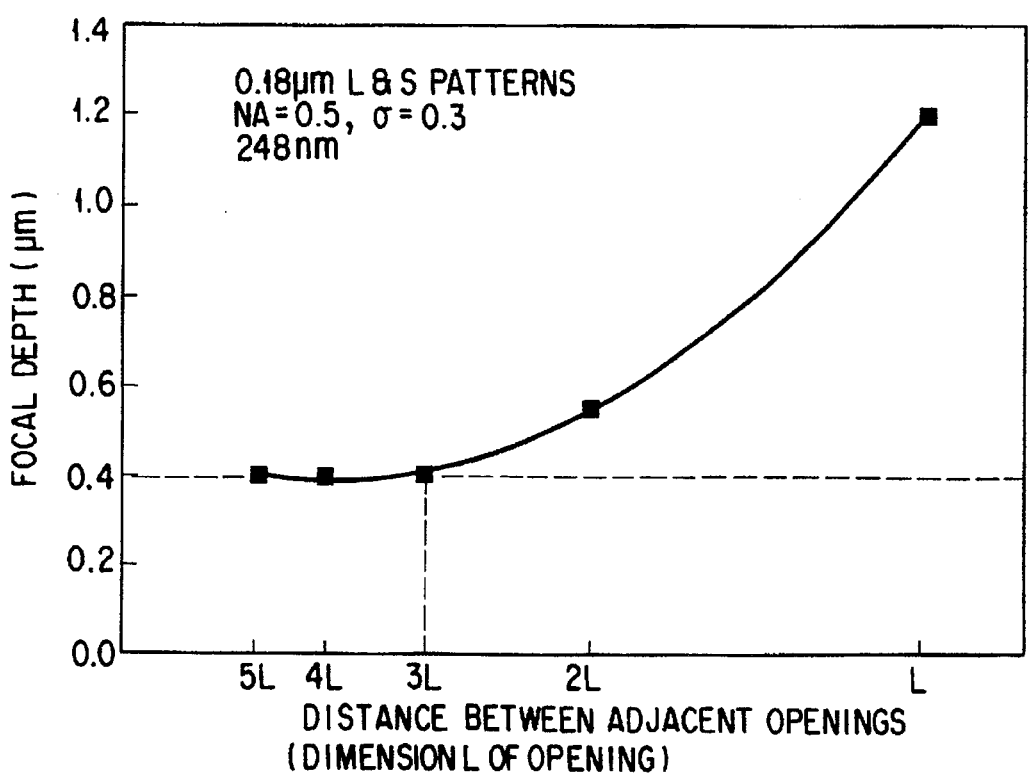
FIG. 20 is a view for explaining a boundary between a periodic pattern and an isolated pattern.

In the fifth aspect of the invention, the distance between the main opening portion and adjacent opening portion is limited to three times or less the width of the main opening portion (3L:L=the dimension of the opening portion). The reason for this is that when the distance is less than this value, as shown in FIG. 20, cyclic characteristics are exhibited and the Levenson method is applicable. Otherwise, the Levenson method is not applicable. In the fifth aspect of the invention, NA=0.5 and σ=0.3. If the dimension 2 is 3L or more while NA=0.4 to 0.6 and δ=0.3 to 0.7, the Levenson method is not applicable.

A process of manufacturing a KrF exposure mask according to the fifth aspect of the invention will now be described.

As is shown in FIG. 21A, a light exposure resist 192 with a thickness of 1.0 μm was formed on an $SiO_2$ exposure transparent substrate 191. The resist 192 was exposed by using a laser plotting apparatus having an I beam source, following which the resist 192 was developed. Thus, a resist pattern 192P was formed, as shown in FIG. 21B.

Then, as shown in FIG. 21C, the resist pattern 192P was used as a mask and the exposed portion of the substrate 191 was subjected to anisotropic etching, using a mixture gas of $CF_4$ and $O_2$. A transparent phase shift pattern 191P was formed of the non-etched portion. The amount of etching at this time was 248 nm, and the non-etched portion was provided with a phase difference of 180°. An allowance for phase difference is ±10° with respect to 180°. If the allowance is within this range, there is no problem.

Subsequently, the resist 192 was removed, as shown in FIG. 21D, by immersing the mask in a mixture solution of sulfuric acid and aqueous hydrogen peroxide. Then, as shown in FIG. 21E, a translucent phase shift film 193 was formed on the surface of the substrate having the transparent phase shift pattern. Specifically, an Si target was used and sputtering was performed in an atmosphere containing a small amount of $N_2$. Thus, an SiN film 80 nm thick was formed.

A light exposure resist 194 with a thickness of 1.0 μm was coated on the substrate, as shown in FIG. 21F. The resist 194 was exposed, using the laser plotting apparatus with the I beam source. The resist 194 was then developed, and a resist pattern 194P was formed, as shown in FIG. 21G.

Using the resist pattern 194P as a mask, the exposed portion of the translucent phase shift film 193 was subjected to anisotropic etching, using $CF_4$ gas. Thereafter, the resist 194 was removed and a translucent shift pattern 193P was formed. Thus, an exposure mask was obtained, as shown in FIG. 21I.

The thus obtained exposure mask was applied to a wiring layer, and an exposure process was performed. Specifically, a resist sensitive to light of 248 nm was formed on a substrate to be processed (a wiring layer) to a thickness of 0.5 μm. The resist was exposed by a light source having a central wavelength at 248 nm through a reduction optical system. In this case, the numerical aperture was 0.5 and the coherent factor was 0.3. As a result, a focal depth of 0.95 μm was obtained both for a periodic pattern and an isolated pattern of 0.18 μm. Accordingly, excellent patterns were obtained by applying the exposure mask according to the fifth aspect of the present invention. In addition, a device manufactured by processing the obtained patterns had very good electrical characteristics. On the other hand, when a conventional exposure mask was used, a focal depth of only 0.33 μm was obtained and the isolated pattern portion had non-uniform dimensions.

In the present example, the translucent phase shift film may be formed of, other than SiNx, one of Si, Ge and GaAs, one of metals of Ti, Al, Cr, Sn, Ta, In, Hf, MSi (M: metal, e.g. Ni, Mo, AlSi, W), one of a nitride, an oxide, a hydride and a halogenide of metal silicide, or a mixture thereof. The intensity transmittance at this time can be controlled within a range of 1 to 16%, depending on purposes.

The material of the transparent substrate is not limited to $SiO_2$, and it may be $CaF_2$, $MgF_2$, $Al_2O_3$, etc. The exposure mask used in the present embodiment is effective not only to the exposure wavelength of KrF, but also to wavelengths of g rays, i rays, h rays, ArF rays, etc.

Example 17

An exposure mask for forming a pattern at an edge portion of a transparent phase shift pattern was manufactured by a method similar to the method of Example 16.

The manufactured mask was applied to a cell isolation layer and an exposure process was performed. Specifically, a resist sensitive to light of 248 nm was formed on a substrate to be processed (a wiring layer) to a thickness of 0.5 μm. The resist was exposed by a light source having a central wavelength at 248 nm through a reduction optical system. In this case, the numerical aperture was 0.5 and the coherent factor was 0.3. As a result, a focal depth of 0.8 μm was obtained both for a 0.13 μm pattern formed by a transparent shifter edge with use of this mask and a 0.18 μm isolated pattern. Accordingly, excellent patterns were obtained by applying the exposure mask according to the fifth aspect of the present invention. In addition, a device manufactured by processing the obtained patterns had very good electrical characteristics. On the other hand, when a conventional exposure mask was used, a focal depth of only 0.2 μm was obtained and the isolated pattern portion had non-uniform dimensions.

In the present example, the translucent phase shift film may be formed of, other than SiNx, one of Si, Ge and GaAs, one of metals of Ti, Al, Cr, Sn, Ta, In, Hf, MSi (M: metal, e.g. Ni, Mo, AlSi, W), one of a nitride, an oxide, a hydride and a halogenide of metal silicide, or a mixture thereof. The intensity transmittance at this time can be controlled within a range of 1 to 16%, depending on purposes.

The material of the transparent substrate is not limited to $SiO_2$, and it may be $CaF_2$, $Al_2O_3$, etc. The exposure mask used in the present embodiment is effective not only to the exposure wavelength of KrF, but also to wavelengths of g rays, i rays, h rays, ArF rays, etc.

Example 18

An exposure mask for a wiring layer was manufactured by a method similar to the method of Example 16. A peripheral area of an isolated opening portion was provided with a region where transparent phase shift patterns having phases opposite to and equal to the phase of the opening portion was repeated cyclically, and a translucent phase shift film having an optical path length differing by 180° from the opening portion was provided on this region.

By using this mask, the same advantages as in Example 16 were obtained, and the processing precision was remarkably enhanced at the time of etching without damaging the resist film.

Example 19

An exposure mask for a cell isolation layer was manufactured by a method similar to the method of Example 17. A peripheral area of an isolated opening portion was provided with a region where transparent phase shift patterns having phases opposite to and equal to the phase of the opening portion was repeated cyclically, and a translucent phase shift film having an optical path length differing by 180° from the opening portion was provided on this region.

By using this mask, the same advantages as in Example 16 were obtained, and the processing precision was remarkably enhanced at the time of etching without damaging the resist film.

Example 20

In the fifth aspect of the invention, a conversion difference can be provided both for a dense pattern and an isolated pattern by narrowing the translucent phase shift pattern. When the conversion difference is provided, the focal depth and exposure amount (through put) tend to be improved. When conversion differences are provided simultaneously for the dense pattern and isolated pattern, it is desirable that the degree of conversion difference be equal.

Regarding the degree of conversion difference, good results can be obtained by setting the mask opening dimension M in the range of $$1.1 W \times B \leq M \leq 1.3 W \times B$$

in relation to the desired dimension W on the wafer. In the formula, B is an inverse number of a transfer magnification of exposure amount. In FIG. 18, the mask pattern was illustrated at 1:1. In fact, however, the opening dimension is set at M/B=0.23 μm (1.27 W) in relation to the pattern dimension W=0.18 μm on the wafer. Thereby, the light intensity is increased. In this case, it is preferable that the translucent portion adjoining the main opening portion overlaps the phase shift portion and the width L, on the mask, of the region having a phase difference of 360° (0°) with respect to the main opening portion is set at $$0.1 W \times B \leq L \leq 0.3 W \times B.$$

When the conversion difference is set, the dense pattern is made to substantially accord with design dimensions, and the isolated pattern alone may be set. In this case, as shown in FIGS. 28A and 28B, a 180° translucent phase shift portion is provided as isolated pattern portion so as to adjoin the main opening portion. FIGS. 28A and 28B show the image intensity on the wafer of the exposure mask manufactured by widening the opening portion by 0.2 W (a value converted on the basis of the dimension on the wafer) with respect to a desired pattern W. By making the opening portion wider than the desired value, as shown in FIG. 28, the isolated pattern can be processed with desired dimensions when the exposure light of the same amount as for the dense pattern is applied.

It is preferable that the mask dimension M is set in the range of $$1.1 W \times B \leq M \leq 1.3 W \times B$$

with respect to the dimension W on the wafer. In the formula, B denotes an inverse number of a transfer magnification of the exposure apparatus. Since the mask dimension M depends on the transmissivity of the mask, the mask dimension M needs to be set in accordance with the transmissivity. In general, the mask dimension M needs to be increased in accordance with an increase in transmissivity.

Example 21

The fifth aspect of the present invention can be variously modified, as described below, in addition to the above-described modes. The modifications will now be briefly described with reference to FIGS. 22 to 27.

Figure 22A:
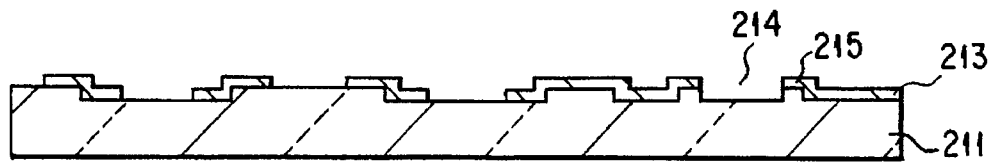
FIGS. 22A and 22B, FIGS. 23A and 23B and FIGS. 24A and 24B are cross-sectional views in which isolated pattern portions alone were manufactured by using the exposure mask according to Example 16 of the invention.
Figure 22B:
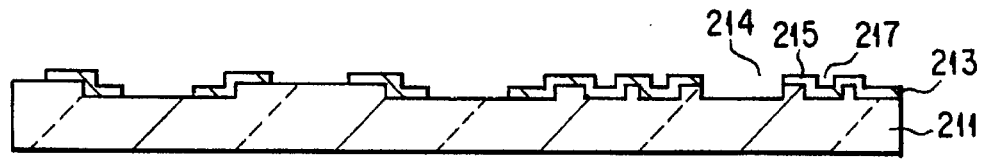

A structure shown in FIG. 22A is basically the same as that shown in FIG. 21I. In FIG. 22A, numeral 211 denotes a substrate, 213 a translucent phase shift film, 214 an isolated opening portion, and 215 a peripheral portion of the opening portion 214. As described above, in this structure, the light intensity is higher in the region outside the peripheral portion 215 than in the opening portion 214. To solve this problem, a unit region 217 is provided, as shown in FIG. 22B. The unit region 217 comprises an overlap region of the translucent phase shift film 215 and transparent phase shift film (projection of the substrate 211) and a region of the translucent phase shift film 215 alone. Thereby, the contrast between the opening portion 214 and the region outside the opening 214 can be enhanced. It is possible to provide a single unit region 217 or a plurality of continuous unit regions 217.

Figure 23A:
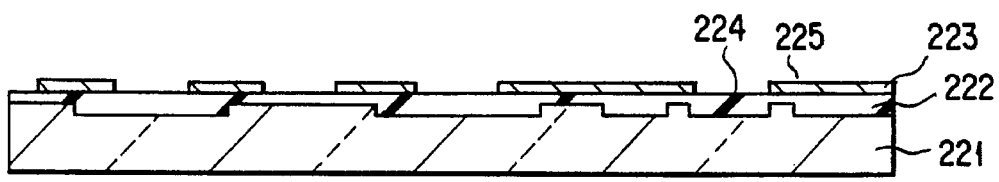
Figure 23B:
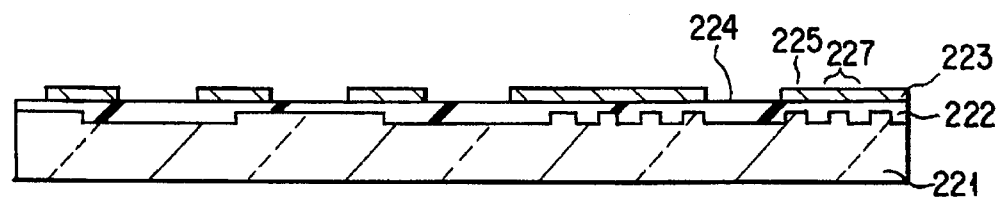

In a modification shown in FIGS. 23A and 23B, a projection of the transparent substrate 221 is not used as transparent phase shift pattern, and a transparent phase shift film 222 is newly provided. The optical structure and operation of this modification are the same as those of the modification shown in FIGS. 22A and 22B. In FIGS. 23A and 23B, numerals 223 to 225 correspond to 213 to 215.

Figure 24A:
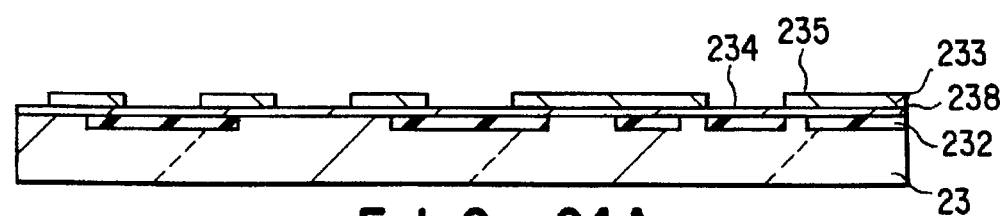
Figure 24B:
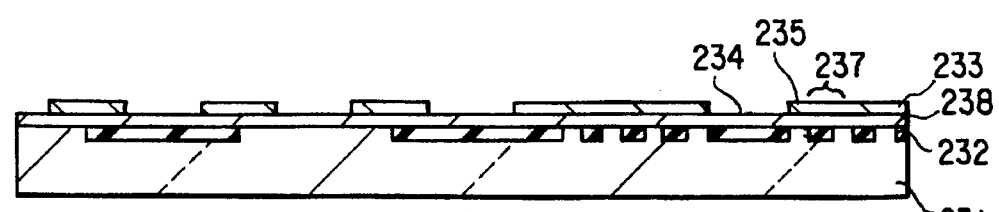

Like FIGS. 23A and 23B, FIGS. 24A and 24B, a transparent phase shift film 232 is used. In addition, the transparent phase shift film 232 is buried in recesses in a transparent substrate 231 and flattened. A flattening transparent film 238 is formed on the transparent phase shift film 232 and a translucent phase shift film 233 is further formed on the flattening transparent film 238. The optical structure and operation of this modification are the same as those of the modification shown in FIGS. 22A and 22B. In FIGS. 24A and 24B, numerals 234 and 235 correspond to 214 and 215.

Figure 25A:
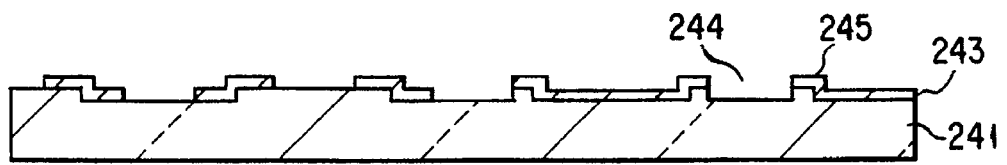
FIGS. 25A and 25B, FIGS. 26A and 26B and FIGS. 27A and 27B are cross-sectional views in which isolated pattern portions and end portions of periodic patterns are manufactured by using the exposure mask according to Example 16 of the invention.
Figure 25B:
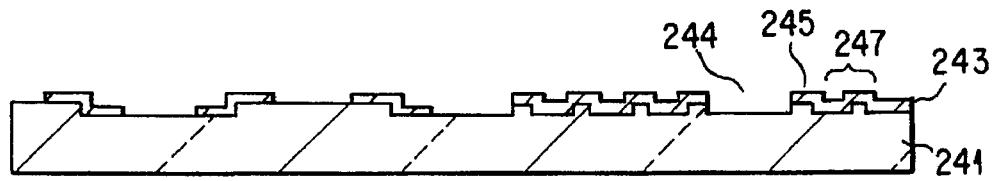

In a modification shown in FIGS. 25A and 25B, in addition to the structure shown in FIGS. 22A and 22B, an overlap region of a translucent phase shift film and transparent phase shift film, which is similar to an isolated pattern, is provided at an end portion of a line & space pattern. In FIGS. 25A and 25B, numerals 241 to 247 correspond to 211 to 217.

Figure 26A:
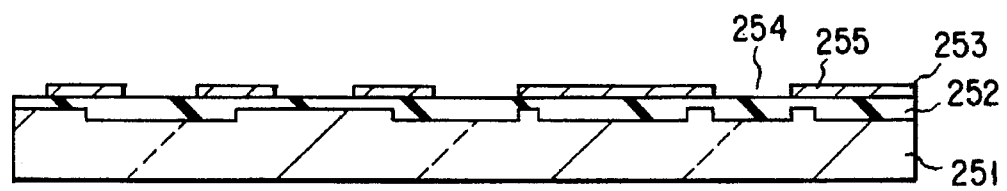
Figure 26B:
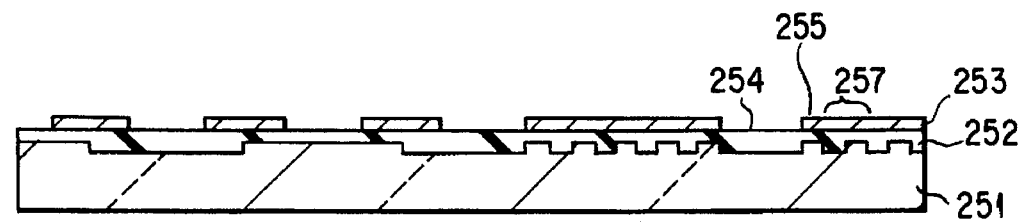

In a modification shown in FIGS. 26A and 26B, in addition to the structure shown in FIGS. 23A and 23B, an overlap region of a translucent phase shift film and transparent phase shift film, which is similar to an isolated pattern, is provided at an end portion of a line & space pattern. In FIGS. 26A and 26B, numerals 251 to 257 correspond to 221 to 227.

Figure 27A:
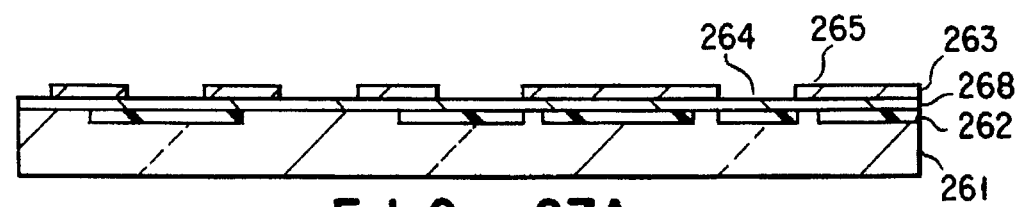
Figure 27B:
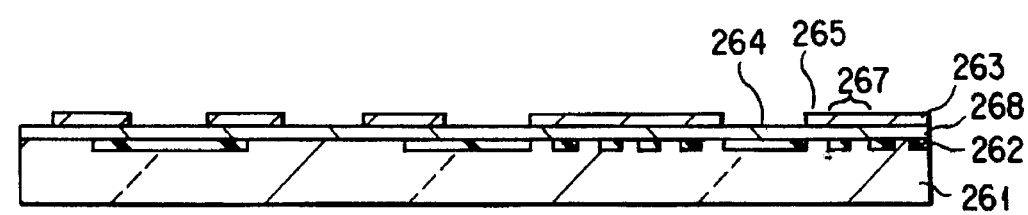

In a modification shown in FIGS. 27A and 27B, in addition to the structure shown in FIGS. 24A and 24B, an overlap region of a translucent phase shift film and transparent phase shift film, which is similar to an isolated pattern, is provided at an end portion of a line & space pattern. In FIGS. 27A and 27B, numerals 261 to 268 correspond to 231 to 238.

As has been described above, by applying the fifth aspect of the present invention, an exposure mask can be manufactured, wherein the balanced light intensities can be obtained between a dense pattern such as a periodic pattern and an isolated pattern. By using this exposure mask, a device with good electrical characteristics can be obtained.

As described in detail, according to the invention, there is provided an improved Levenson-type phase shift mask, wherein opaque patterns of a conventional Levenson-type are replaced by translucent phase shift patterns which are used in combination with transparent phase shift patterns to produce finely defined patterns.

The fact that translucent phase shift patterns are partly laid on respective transparent phase shift patterns in an exposure mask according to the invention also serves to provide finely defined patterns.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An exposure mask characterized in that the exposure mask is formed by providing a mask pattern comprising a transparent phase shift pattern and a translucent phase shift pattern on a light-transmissive substrate, said transparent phase shift pattern and said translucent phase shift pattern cause a phase difference of 180° to exposure light passing through said transparent phase shift pattern relative to exposure light passing through said light transmissive substrate and said translucent phase shift pattern, at least one opening portion in the mask pattern having at an adjacent region an overlap region of said transparent phase shift pattern and said translucent phase shift pattern region, and a region of said translucent phase shift pattern provided on the outside of said overlap region.

2. The exposure mask according to claim 1, wherein the at least one opening portion on the light-transmissive substrate is formed along an outer peripheral portion of a dense pattern group, the transparent phase shift pattern and translucent phase shift pattern having an optical path length differing by about 180° from the opening portion, a region of the translucent phase shift pattern having an optical path length differing by about 180° from the opening portion provided on the outside of the overlap region.

3. The exposure mask according to claim 2, wherein said opening portion has a distance from an adjacent opening portion which is three times or more the width of the opening portion.

4. The exposure mask according to claim 2, wherein said opening portion has a distance from an adjacent opening portion which is three times or less the width of the opening portion.

5. The exposure mask according to claim 1, wherein said translucent shift pattern is formed of one selected from among the group consisting of silicon, germanium, gallium arsenide, titanium, aluminum, chromium, tin, indium, nickel, cobalt, tantalum, hafnium and metal silicide, and oxides, nitrides, hydrides, carbides and halogenides thereof, and a mixture thereof.

6. The exposure mask according to claim 1, wherein said mask pattern includes a dense portion and an isolated portion, the transparent phase shift pattern is formed in one of adjacent opening portions in said dense portion, a translucent light shield portion between the opening portions being separated into two regions, one being formed of the translucent phase shift pattern, the other being formed of the translucent phase shift pattern and the transparent phase shift pattern, each of said separated regions having a phase difference of 180° for exposure light with respect to the adjacent opening, and an overlap region of the transparent phase shift pattern and the translucent phase shift pattern is formed near the opening in said isolated portion, and a region of the translucent phase shift pattern alone is formed on the outside of said overlap region.

7. The exposure mask according to claim 1, wherein said transparent phase shift pattern partly overlaps said translucent phase shift pattern.

8. The exposure mask according to claim 1, wherein said translucent phase shift pattern is formed to include a boundary portion of said transparent phase shift pattern.

9. An exposure mask according to claim 1, wherein a region includes an area having a phase of 360° and located adjacent to said opening portion, and an area having a phase of 180° and located in an outer side of said area having a phase of 360°.

10. An exposure mask characterized in that the exposure mask is formed by providing a mask pattern comprising a transparent phase shift pattern and a translucent phase shift pattern on a light-transmissive substrate, said transparent phase shift pattern and said translucent phase shift pattern cause a phase difference of 180° to exposure light passing through said transparent phase shift pattern relative to exposure light passing through said light-transmissive substrate and said translucent phase shift pattern, at least one opening portion in the mask pattern having at an adjacent region an overlap region of said transparent phase shift pattern and said translucent phase shift pattern, and at least one unit region comprising first and second regions on the outside of said overlap region, the first region being a region of said translucent phase shift pattern and the second region being a region where said transparent phase shift pattern overlaps said translucent phase shift pattern.

11. The exposure mask according to claim 10, wherein at least one opening portion on the light-transmissive substrate is formed along an outer peripheral portion of a dense pattern group, the opening portion having at least at an adjacent region an overlap region of the transparent phase shift pattern and the translucent phase shift pattern, each of the transparent phase shift pattern and translucent phase shift pattern having an optical path length differing by about 180° from the opening portion for exposure light, and the at least one unit region having an optical path length differing by about 180° from the opening portion and an overlap region of the transparent phase shift pattern and the translucent phase shift pattern, each of which has an optical path length differing by about 180° from the opening portion and is provided on the outside of the overlap region.

12. The exposure mask according to claim 11, wherein said opening portion has a distance from an adjacent opening portion which is substantially three times or more the width of the opening portion.

13. The exposure mask according to claim 11, wherein said opening portion has a distance from an adjacent opening portion which is substantially three times or less the width of the opening portion.

14. The exposure mask according to claim 10, wherein said translucent shift pattern is formed of one selected from among the group consisting of silicon, germanium, gallium arsenide, titanium, aluminum, chromium, tin, indium, nickel, cobalt, tantalum, hafnium and metal silicide, and oxides, nitrides, hydrides, carbides and halogenides thereof, and a mixture thereof.

15. The exposure mask according to claim 10, wherein said mask pattern includes a dense portion and an isolated portion, the transparent phase shift pattern is formed in one of adjacent opening portions in said dense portion, a translucent light shield portion between the opening portions being separated into two regions, one being formed of the translucent phase shift pattern, the other being formed of the translucent phase shift pattern and the transparent phase shift pattern, each of said separated regions having a phase difference of 180° for exposure light with respect to the adjacent opening, and an overlap region of the transparent phase shift pattern and the translucent phase shift pattern is formed near the opening in said isolated portion, and a region of the translucent phase shift pattern alone is formed on the outside of said overlap region.

16. The exposure mask according to claim 10, wherein said transparent phase shift pattern partly overlaps said translucent phase shift pattern.

17. The exposure mask according to claim 10, wherein said translucent phase shift pattern is formed to include a boundary portion of said transparent phase shift pattern.

18. An exposure mask according to claim 10, wherein a region includes an area having a phase of 360° and located adjacent to said opening portion and an area having a phase of 180° and located in an outer side of said area having a phase of 360°.

19. An exposure method for subjecting an object to be processed to an exposure process by using an exposure mask formed by providing a mask pattern comprising a transparent phase shift pattern and a translucent phase shift pattern on a light-transmissive substrate, said transparent phase shift pattern and said translucent phase shift pattern of said exposure mask cause a phase difference of 180° to exposure light passing through said transparent phase shift pattern relative to exposure light passing through said light transmissive substrate and said translucent phase shift pattern, at least one opening portion in the mask pattern having at an adjacent region an overlap region of said transparent phase shift pattern and said translucent phase shift pattern, and a region of said translucent phase shift pattern provided on the outside of said overlap region.

20. The exposure method according to claim 19, wherein said transparent phase shift pattern partly overlaps said translucent phase shift pattern.

21. The exposure mask according to claim 19, wherein said translucent phase shift pattern is formed to include a boundary portion of said transparent phase shift pattern.

22. An exposure method for subjecting an object to be processed to an exposure process, by using an exposure mask formed by providing a mask pattern comprising a transparent phase shift pattern and a translucent phase shift pattern on a light-transmissive substrate, said transparent phase shift pattern and said translucent phase shift pattern of said exposure mask cause a phase difference of 180° to exposure light passing through said transparent phase shift pattern and said translucent phase shift pattern, at least one opening portion in the mask pattern having at an adjacent region an overlap region of said transparent phase shift pattern and said translucent phase shift pattern, and at least one unit region comprising first and second regions on the outside of said overlap region, the first region being a region of said translucent phase shift pattern and the second region being a region where said transparent phase shift pattern overlaps said translucent phase shift pattern.

23. The exposure method according to claim 22, wherein said transparent phase shift pattern partly overlaps said translucent phase shift pattern.

24. The exposure mask according to claim 22, wherein said translucent phase shift pattern is formed to include a boundary portion of said transparent phase shift pattern.

* * * * *